US011049719B2

(12) United States Patent
Hawrylchak et al.

(10) Patent No.: US 11,049,719 B2
(45) Date of Patent: Jun. 29, 2021

(54) EPITAXY SYSTEM INTEGRATED WITH HIGH SELECTIVITY OXIDE REMOVAL AND HIGH TEMPERATURE CONTAMINANT REMOVAL

(71) Applicant: Applied Materials, Inc., Santa Clara, CA (US)

(72) Inventors: Lara Hawrylchak, Gilroy, CA (US); Kin Pong Lo, Fremont, CA (US); Errol C. Sanchez, Tracy, CA (US); Schubert S. Chu, San Francisco, CA (US); Tushar Mandrekar, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 137 days.

(21) Appl. No.: 16/057,213

(22) Filed: Aug. 7, 2018

(65) Prior Publication Data
US 2019/0067006 A1    Feb. 28, 2019

Related U.S. Application Data

(60) Provisional application No. 62/552,145, filed on Aug. 30, 2017.

(51) Int. Cl.
*C30B 25/18*    (2006.01)
*H01L 21/02*    (2006.01)
(Continued)

(52) U.S. Cl.
CPC ...... *H01L 21/02658* (2013.01); *B08B 7/0035* (2013.01); *C23C 16/0236* (2013.01); *C23C 16/0245* (2013.01); *C23C 16/24* (2013.01); *C23C 16/46* (2013.01); *C23C 16/54* (2013.01); *C30B 25/02* (2013.01); *C30B 33/08* (2013.01);
(Continued)

(58) Field of Classification Search
CPC ......... C30B 23/00; C30B 25/18; C30B 29/08; C23C 16/00
See application file for complete search history.

(56) References Cited

U.S. PATENT DOCUMENTS 6,953,742 B2 * 10/2005 Chen ................... H01L 21/2855
438/622
2003/0017628 A1   1/2003 Li et al.
(Continued)

OTHER PUBLICATIONS

International Search Report and Written Opinion dated Dec. 4, 2018 for Application No. PCT/US2018/046497.
(Continued)

*Primary Examiner* — Robert M Kunemund
(74) *Attorney, Agent, or Firm* — Patterson + Sheridan, LLP

(57) ABSTRACT

In one implementation, a processing system includes a first transfer chamber coupling to at least one epitaxy process chamber, a second transfer chamber, a transition station disposed between the first transfer chamber and the second transfer chamber, a first plasma chamber coupled to the second transfer chamber for removing oxides from a surface of a substrate, and a load lock chamber coupled to the second transfer chamber. The transition station connects to the first transfer chamber and the second transfer chamber, and the transition station includes a second plasma chamber for removing contaminants from the surface of the substrate.

17 Claims, 10 Drawing Sheets

(51) Int. Cl.
*C23C 16/02* (2006.01)
*B08B 7/00* (2006.01)
*H01L 21/67* (2006.01)
*H01J 37/32* (2006.01)
*H01L 21/687* (2006.01)
*C30B 25/02* (2006.01)
*C23C 16/54* (2006.01)
*C30B 33/08* (2006.01)
*C23C 16/24* (2006.01)
*C23C 16/46* (2006.01)

(52) U.S. Cl.
CPC .. *H01J 37/32357* (2013.01); *H01J 37/32724* (2013.01); *H01J 37/32899* (2013.01); *H01L 21/02046* (2013.01); *H01L 21/0262* (2013.01); *H01L 21/02381* (2013.01); *H01L 21/02532* (2013.01); *H01L 21/67028* (2013.01); *H01L 21/67103* (2013.01); *H01L 21/67109* (2013.01); *H01L 21/67115* (2013.01); *H01L 21/67167* (2013.01); *H01L 21/67184* (2013.01); *H01L 21/67207* (2013.01); *H01L 21/67248* (2013.01); *H01L 21/68742* (2013.01); *H01L 21/68785* (2013.01); *H01L 21/68792* (2013.01); *H01J 37/321* (2013.01); *H01J 37/32091* (2013.01); *H01J 2237/002* (2013.01); *H01J 2237/335* (2013.01); *H01L 21/02049* (2013.01); *H01L 21/0254* (2013.01); *H01L 21/02546* (2013.01)

(56) References Cited

U.S. PATENT DOCUMENTS

| | | | |
|---|---|---|---|
| 2003/0087520 A1* | 5/2003 | Chen | H01L 21/2855 438/643 |
| 2005/0233093 A1* | 10/2005 | Tada | C23C 16/4408 427/569 |
| 2007/0020890 A1 | 1/2007 | Thakur et al. | |
| 2007/0113868 A1 | 5/2007 | Fu et al. | |
| 2007/0181057 A1 | 8/2007 | Lam et al. | |
| 2009/0017227 A1 | 1/2009 | Fu et al. | |
| 2012/0034761 A1 | 2/2012 | Kuppurao et al. | |
| 2014/0011339 A1 | 1/2014 | Zheng et al. | |
| 2014/0273488 A1* | 9/2014 | Wang | H01L 21/6719 438/715 |
| 2015/0040822 A1* | 2/2015 | Olsen | C30B 29/08 117/97 |
| 2018/0182627 A1* | 6/2018 | Omstead | C23C 16/45536 |

OTHER PUBLICATIONS

Notice of Reasons for Refusal (Translated) in related application TW 2020-512399 dated Mar. 18, 2021.

Korean Office Action in related application KR 10-2020-7008638 dated May 5, 2021.

* cited by examiner

EPITAXY SYSTEM INTEGRATED WITH HIGH SELECTIVITY OXIDE REMOVAL AND HIGH TEMPERATURE CONTAMINANT REMOVAL

CROSS-REFERENCE TO RELATED APPLICATION

This application claims benefit of U.S. Provisional Patent Application Ser. No. 62/552,145, filed Aug. 30, 2017, which application is hereby incorporated by reference herein.

FIELD

Implementations of the present disclosure generally relate to an apparatus and a method for cleaning a surface of a substrate.

BACKGROUND

Integrated circuits are formed in and on silicon and other semiconductor substrates. In the case of single crystal silicon, substrates are made by growing an ingot from a bath of molten silicon, and then sawing the solidified ingot into multiple substrates. An epitaxial silicon layer may then be formed on the monocrystalline silicon substrate to form a defect free silicon layer that may be doped or undoped. Semiconductor devices, such as transistors, may be manufactured from the epitaxial silicon layer. The electrical properties of the formed epitaxial silicon layer are generally better than the properties of the monocrystalline silicon substrate.

Surfaces of the monocrystalline silicon and the epitaxial silicon layer are susceptible to contamination when exposed to typical substrate fabrication facility ambient conditions. For example, a native oxide layer may form on the monocrystalline silicon surface prior to deposition of the epitaxial layer due to handling of the substrates and/or exposure to ambient environment in the substrate processing facility. Additionally, foreign contaminants such as carbon and oxygen species present in the ambient environment may deposit on the monocrystalline surface. The presence of a native oxide layer or contaminants on the monocrystalline silicon surface negatively affects the quality of an epitaxial layer subsequently formed on the monocrystalline surface. It is therefore desirable to pre-clean the substrates in order to remove the surface oxidation and other contaminants before epitaxial layers are grown on the substrates. However, pre-clean processes are often carried out in one or more standalone vacuum process chambers, which may increase substrate handling time and chances of exposing substrates to ambient environment.

Therefore, there is a need in the art to provide an improved substrate processing system for cleaning a substrate surface prior to performing an epitaxial deposition process that minimizes substrate handling time and exposure to ambient environment.

SUMMARY

This disclosure describes a vacuum processing system, that includes a first transfer chamber coupled to at least one film formation chamber, a second transfer chamber, a plasma oxide removal chamber coupled to the first or second transfer chamber, a plasma contaminant removal chamber coupled to the first or second transfer chamber, and a load lock chamber coupled to the second transfer chamber.

Also described herein is a method of processing a substrate, comprising removing oxides from a substrate by a process that includes exposing the substrate to a processing gas comprising $NF_3$ and HF; removing hydrocarbon contaminants from the substrate by a process that includes exposing the substrate to hydrogen radicals; and forming a film on the substrate by an epitaxy process.

Also described herein is a vacuum processing apparatus, comprising a first transfer chamber; at least one vapor phase epitaxy chamber coupled to the first transfer chamber; a plasma oxide removal chamber coupled to the first transfer chamber, the plasma oxide removal chamber comprising a showerhead with a mixing chamber and a gas distributor; a first gas inlet formed through a portion of the showerhead and in fluid communication with the mixing chamber; a second gas inlet formed through a portion of the showerhead and in fluid communication with the mixing chamber; and a substrate support with a substrate supporting surface; a cooling channel embedded in the substrate support; and a plasma-driven contaminant removal chamber coupled to the first or second transfer chamber, the plasma contaminant removal chamber comprising a plasma source; and a substrate support operable to heat a substrate disposed thereon to a temperature between 25 degrees Celsius and 650 degrees Celsius.

Also described herein is a vacuum processing apparatus, comprising a first transfer chamber; a second transfer chamber coupled to the first transfer chamber by one or more pass-through stations; at least one vapor phase epitaxy chamber coupled to the second transfer chamber; a plasma oxide removal chamber coupled to the first or second transfer chamber, the plasma oxide removal chamber comprising a showerhead with a mixing chamber and a gas distributor; a first gas inlet formed through a portion of the showerhead and in fluid communication with the mixing chamber; a second gas inlet formed through a portion of the showerhead and in fluid communication with the mixing chamber; a third gas inlet formed through a portion of the showerhead and in fluid communication with the mixing chamber; and a substrate support with a substrate supporting surface; a cooling channel and one or more resistive heaters embedded in the substrate support; a plasma-driven contaminant removal chamber coupled to the first or second transfer chamber, the plasma contaminant removal chamber comprising a plasma source; a magnetic ion filter; and a substrate support operable to heat a substrate disposed thereon to a temperature between 25 degrees Celsius and 650 degrees Celsius; and a load lock chamber coupled to the second transfer chamber.

BRIEF DESCRIPTION OF THE DRAWINGS

Implementations of the present disclosure, briefly summarized above and discussed in greater detail below, can be understood by reference to the illustrative implementations of the disclosure depicted in the appended drawings. It is to be noted, however, that the appended drawings illustrate only typical implementations of this disclosure and are therefore not to be considered limiting of its scope, for the disclosure may admit to other equally effective implementations.

Figure 1:
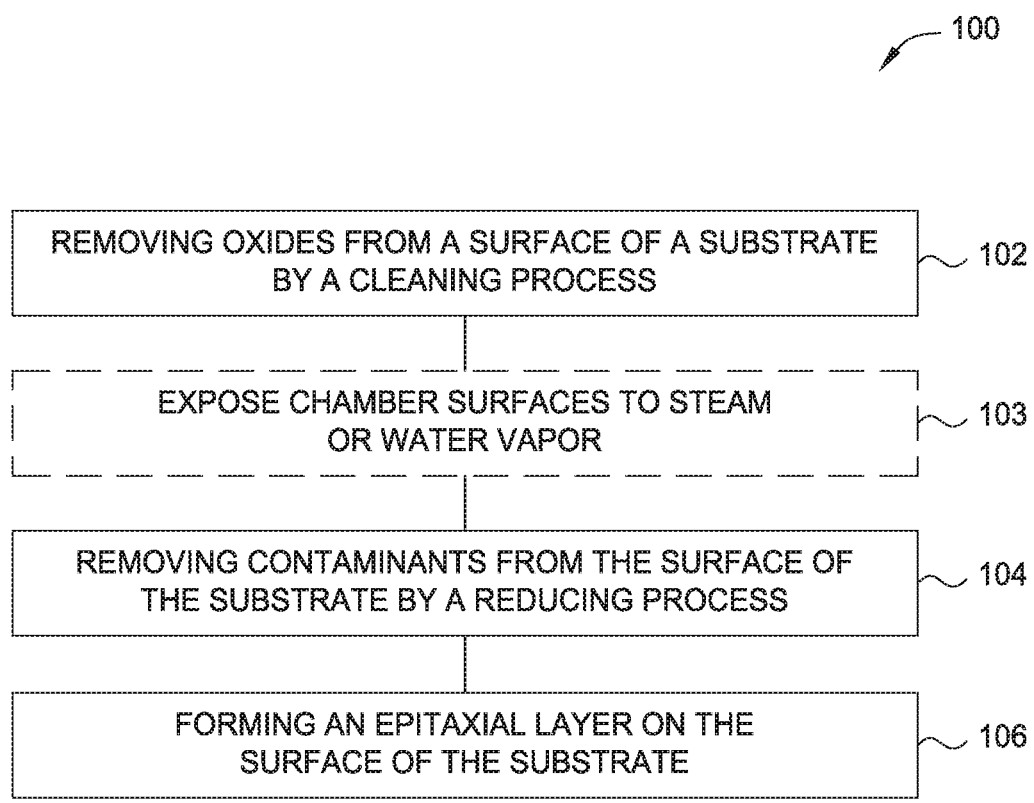
FIG. 1 illustrates a processing sequence in accordance with one implementation of the present disclosure.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

FIG. 1 illustrates a processing sequence 100 in accordance with one implementation of the present disclosure. In some embodiments, two or more of the boxes 102-106 of the processing sequence 100 may be performed in one processing system, such as a vacuum processing system illustrated in FIG. 9, which is further described below.

In box 102, oxides are removed from a surface of a semiconductor substrate using a cleaning process. The substrate may include a silicon containing material and the surface may include a material, such as silicon (Si), germanium (Ge) or silicon germanium alloys (SiGe). In some implementations, the Si, Ge, or SiGe surface may have an oxide layer, such as a native oxide layer, and contaminants disposed thereon. Due to the sensitivity of epitaxial deposition processes to oxides and contaminants, such as carbon containing contaminants, surface contamination resulting from exposure to most typical cleanroom environments for a few hours can become significant enough for the accumulated oxides and contaminants to affect the quality of a subsequently formed epitaxial layer.

The substrate surface may be cleaned by performing an oxide removal process and a contaminant removal process. In one implementation, the oxides are removed from the surface of the substrate using a cleaning process (box 102), and the contaminants, such as carbon containing contaminants, are removed from the surface of the substrate using a reducing process (box 104). The cleaning process(es) performed in box 102 may include a process that utilizes a plasma to remove any unwanted contaminants. The plasma process may use a plasma formed form a gas including hydrogen ($H_2$), helium (He), argon (Ar), ammonia ($NH_3$), a fluorine containing gas, such as $NF_3$ or HF, or any combination of these gases. The plasma may be inductively or capacitively coupled, or the plasma may be formed by a microwave source in a processing chamber. The processing chamber may be a remote plasma chamber that is spatially separated from a processing region in which the substrate is disposed. The term "spatially separated" described herein may refer to a plasma formation region that is separated from a substrate processing region by one or more chamber components such as a blocker plate 228 and a gas distribution plate 230 shown in FIG. 2A, or even a conduit between a remote plasma chamber and a substrate processing chamber.

In one implementation, the plasma is formed using a capacitively coupled plasma source. Radicals from the plasma may pass through a gas distribution plate disposed above the substrate, which is positioned on a support at a temperature of about 5 degrees Celsius to about 100 degrees Celsius, such as a temperature of about 5 degrees Celsius to about 75 degrees Celsius, for example about 10 degrees Celsius. The processing pressure may be at subatmospheric pressure, for example a pressure between about 500 mTorr and about 20 Torr, such as between about 2 Torr and about 10 Torr. Radicals reach the substrate and then react with the surface oxides. Exemplary processing chambers that can be adapted to perform the plasma etching process include the SiCoNi™ or Selectra™ chambers, which are available from Applied Materials, Inc., of Santa Clara, Calif. Chambers from other manufacturers may also be used.

In one exemplary implementation, the plasma cleaning process is a remote plasma assisted dry cleaning process which involves the concurrent exposure of a substrate to $NF_3$ and $NH_3$, optionally including plasma by-products of one or more of the gases. Inert gases such as argon and helium may also be used. Any one, or combination of the three gases, inert/$NF_3$/$NH_3$ may be exposed to energy, as described above, to form a plasma thereof. The plasma is mixed with the other gases prior to delivery to the process chamber, or the plasma and other gases may be provided to the process chamber along different pathways, mixing upon arrival to the process chamber. In one example, the plasma cleaning process may be similar to or may include a SiCoNi™ process that is available from Applied Materials, Inc., of Santa Clara, Calif.

The remote plasma process can be largely conformal and selective for oxide layers, and thus does not readily etch silicon, germanium, or nitride layers regardless of whether the layers are amorphous, crystalline or polycrystalline. Selectivity of the $NF_3$/$NH_3$ plasma cleaning process for oxide versus silicon or germanium is at least about 3:1, and usually 5:1 or better, sometimes 10:1. The $NF_3$/$NH_3$ plasma cleaning process is also highly selective of oxide versus nitride. The selectivity of the $NF_3$/$NH_3$ plasma cleaning process versus nitride is at least about 3:1, usually 5:1 or better, sometimes 10:1.

In some embodiments, either during the remote plasma process or after performing the remote plasma process, an amount of thermal energy can be applied to the processed substrate to help remove any generated by-products. In some embodiments, the thermal energy is provided via a radiant, convective and/or conductive heat transfer process that causes the unwanted by-products found on the substrate surface to sublimate.

At box 103, an optional chamber conditioning step may be performed in the chamber to be used for the operation performed at box 104. The operation performed at box 103 includes use of a gas containing hydrogen radicals, so that the exposed chamber surfaces may become passivated. In some embodiments, the chamber surfaces may be passivated by exposure to steam or water vapor. The steam may be generated ex-situ or in-situ by known methods, and the chamber surfaces may be exposed to the steam for a period of 1 second to 60 seconds, for example about 30 seconds, to yield surfaces with at least slightly improved resistance to hydrogen radicals. During the steam passivation process, an active production substrate may be present in the processing chamber disposed on the substrate support. Alternately, a dummy substrate may be positioned on the substrate support. If the substrate support is made of a material that might react with steam, positioning a substrate on the support during the steam passivation process may reduce reactivity with steam. The substrate may be heated during the steam passivation process to a temperature of 400 degrees Celsius, or higher.

In box 104, after removing oxides from the surface of the substrate by use of the process(es) performed in box 102, any remaining contaminants on the surface of the substrate are removed. In one implementation of box 104, contaminants such as carbon or hydrocarbons are removed from the surface of the substrate using a reducing process. The reducing process may use a hydrogen containing plasma to remove contaminants. The plasma may be formed from a cleaning gas containing hydrogen gas ($H_2$), helium (He), argon (Ar), ammonia ($NH_3$), or any combination of these gases. The plasma may be formed by use of inductively or capacitively coupled plasma source, or the plasma may be formed by use of a microwave source that is coupled to a processing chamber. In some embodiments, the plasma may be formed by use of inductively or capacitively coupled plasma source that includes an RF, VHF and/or UHF power source. The plasma source may be a remote plasma chamber that is physically separated from the processing chamber where the substrate is disposed.

In one implementation, the plasma is formed using an inductively coupled plasma source that is a remote plasma source (RPS) to perform the reducing process performed at box 104. Radicals from the plasma may pass through a passage tube and a gas distribution plate disposed above the substrate. The substrate is positioned on a support at a temperature of about 25 degrees Celsius to about 650 degrees Celsius, such as between about 100 degrees Celsius and about 500 degrees Celsius, in some cases at least about 400 degrees Celsius, in some cases about 400 degrees Celsius. The processing pressure may be at subatmospheric pressure, for example a pressure less than about 5 Torr, or a pressure of less than about 1 Torr, or even a pressure of between about 100 mTorr to about 1 Torr. Exemplary processing chambers that can be adapted to perform a reducing process include AKTIV Pre-Clean™, PCxT Reactive Preclean™ (RPC), or Selectra™ chambers, available from Applied Materials, Inc., of Santa Clara, Calif. Chambers from other manufacturers may also be used.

The remote plasma process forms a gas containing hydrogen radicals. As described above, the hydrogen containing plasma is passed through a conduit surrounded by a magnetic field that diverts charged particles while allowing neutral particles, such as hydrogen radicals, and other radicals and molecules, to pass through to the processing region containing the substrate. The substrate is exposed to the gas containing hydrogen radicals to perform the reducing process, which removes contaminants including carbon. The process also leaves the surface of the substrate uniformly hydrogen terminated with minimal defects in the crystal structure at the substrate surface.

In box 106, an epitaxial layer is formed on the surface of the substrate. If cleaned prior, as described above, the surface of the substrate is uniformly oxide and contaminant free which improves the quality of grown epitaxial layers formed on the surface of the substrate. An exemplary epitaxial process may be a selective epitaxial process performed at a temperature that is less than about 800 degrees Celsius, for example about 450 to 650 degrees Celsius. The epitaxial layer may be formed using a high temperature chemical vapor deposition (CVD) process. The epitaxial layer may be a crystalline silicon, germanium, or silicon germanium, or any suitable semiconductor material such as a Group III-V compound or a Group II-VI compound. In one exemplary thermal CVD process, processing gases such as chlorosilanes $SiH_xCl_{4-x}$ (mono, di, tri, tetra), silanes $Si_xH_{2x+2}$ (silane, disilane, trisilane, etc.), germanes $Ge_xH_{2x+2}$ (germane, digermane, etc.), hydrogen chloride HCl, chlorine gas $Cl_2$, or combinations thereof are used to form the epitaxial layer. The processing temperature is under 800 degrees Celsius, such as about 300 degrees Celsius to about 600 degrees Celsius, for example about 450 degrees Celsius, and the processing pressure is between 5 Torr and 600 Torr. An exemplary processing chamber that can be used to perform the epitaxial deposition process is the Centura™ Epi chamber, which is available from Applied Materials, Inc., of Santa Clara, Calif. Chambers from other manufacturers may also be used.

Referring back to FIG. 1, it is contemplated that processes described in boxes 102 and 104 may be reversed. In addition, the processes described in boxes 102 and 104 may be repeated as many times as necessary. It should be noted that the processes of 102 and 104 may be performed in one chamber, or in two chambers. In the event that the processes 102 and 104 are performed in one chamber, an optional flush may be performed between the processes using inert gases to provide separation between the process chemistries. An optional thermal treatment may also be performed between or after the processes 102 and 104, before performing the layer formation process of 106, to remove any residual by-products or contaminants, and to anneal the surface to remove any surface defects. Such an anneal may be performed under a hydrogen atmosphere, optionally including an inert gas such as argon and helium, and may be performed at temperatures of 400 to 800 degrees Celsius and pressures from 1 Torr to 300 Torr.

Figure 2A:
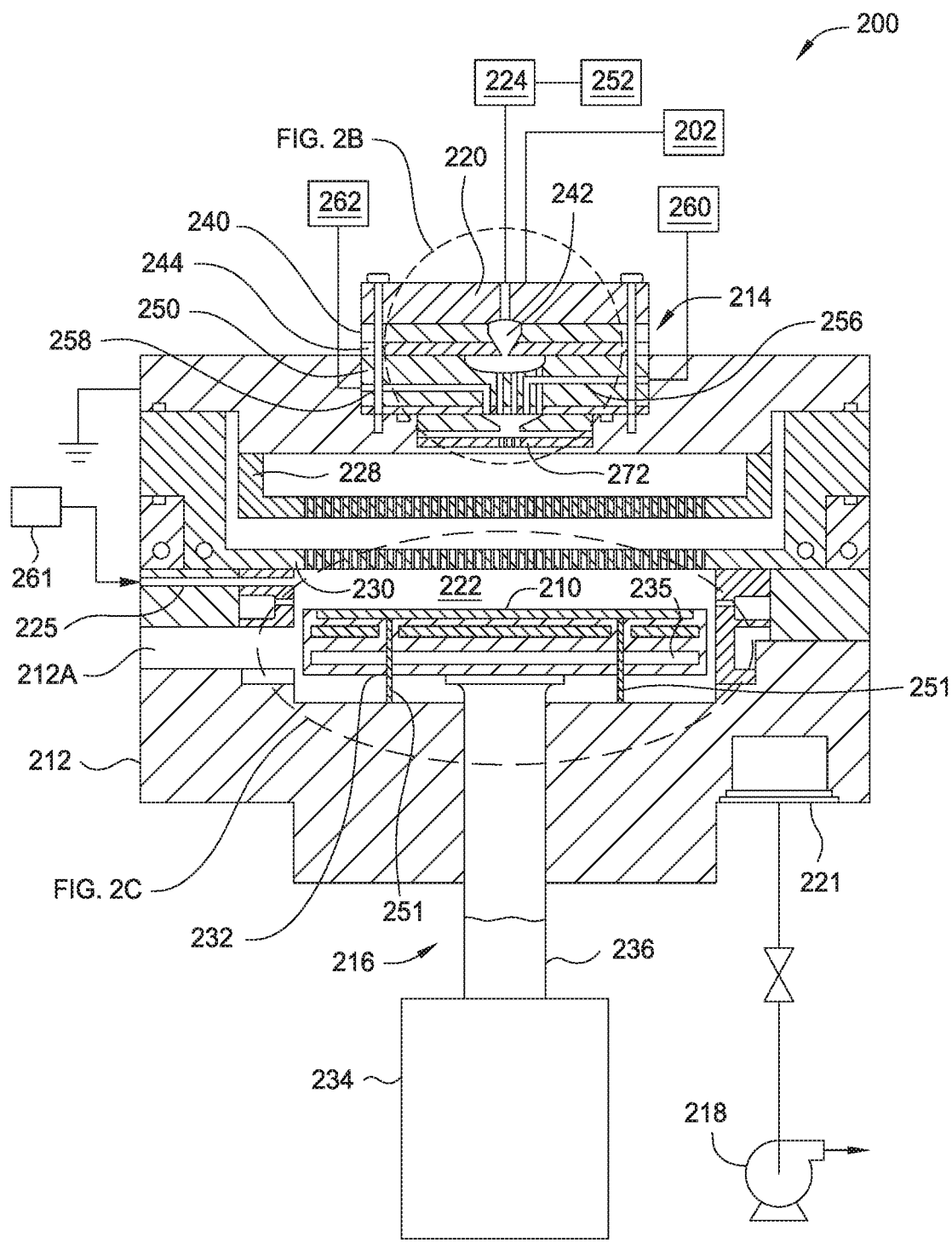
FIG. 2A is a cross-sectional view of a cleaning chamber used to perform a cleaning process of FIG. 1 in accordance with one implementation of the present disclosure.
Figure 2B:
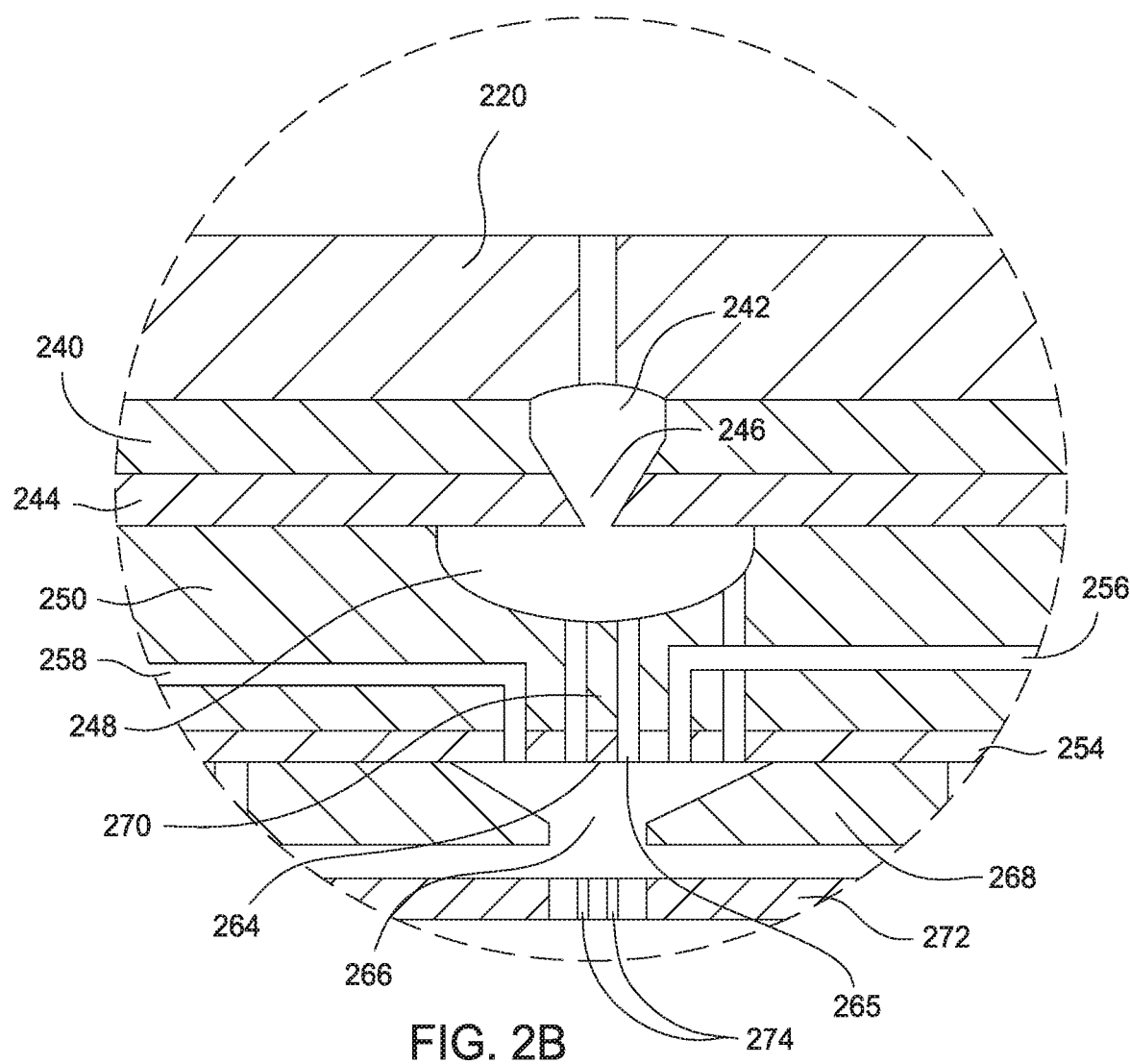
FIG. 2B is an enlarged view of a portion of the processing chamber of FIG. 2A.

FIG. 2A is a cross sectional view of a processing chamber 200 that is adapted to perform at least some of the processes found in box 102, and thus is configured to remove contaminants, such as oxides, from a surface of a substrate. FIG. 2B is an enlarged view of a portion of the processing chamber 200 of FIG. 2A.

The processing chamber 200 may be particularly useful for performing a thermal or plasma-based cleaning process and/or a plasma assisted dry etch process. The processing chamber 200 includes a chamber body 212, a lid assembly 214, and a support assembly 216. The lid assembly 214 is disposed at an upper end of the chamber body 212, and the support assembly 216 is at least partially disposed within the chamber body 212. A vacuum system can be used to remove gases from processing chamber 200. The vacuum system includes a vacuum pump 218 coupled to a vacuum port 221 disposed in the chamber body 212. The processing chamber 200 also includes a controller 202 for controlling processes within the processing chamber 200.

The lid assembly 214 includes a plurality of stacked components configured to provide precursor gases and/or a plasma to a processing region 222 within the chamber 200.

A first plate 220 is coupled to a second plate 240. A third plate 244 is coupled to the second plate 240. The lid assembly 214 may be connected to a power source 224 for supplying a plasma to a cone-shaped chamber 242 formed in the lid assembly 214. The lid assembly 214 can also be connected to a remote plasma source that creates the plasma upstream of the lid stack. The remote plasma cavity (e.g., items 222, 220, 240 in FIGS. 2A-2B) is coupled to a gas source 252 (or the gas source 252 is coupled directly to the lid assembly 214 in the absence of the remote plasma source 224). The gas source 252 may include a gas source that is configured to provide helium, argon, or other inert gas. In some configurations, the gas provided by the gas source 252 can be energized into a plasma that is provided to the lid assembly 214 by use of the remote plasma source 224. In alternate embodiments, the gas source 252 may provide process gases that can be activated by the remote plasma source 224 prior to being introduced to a surface of the substrate that is disposed within the processing chamber 200. Referring to FIG. 2B, the cone-shaped chamber 242 has an opening 246 that allows a formed plasma to flow from the remote plasma source 224 to a volume 248 formed in a fourth plate 250 of the lid assembly 214.

In some configurations of the lid assembly 214, a plasma is generated within the cone-shaped chamber 242 by the application of energy delivered from a plasma source. In one example, the energy can be provided by biasing the lid assembly 214 to capacitively couple RF, VHF and/or UHF energy to the gases positioned in the cone-shaped chamber 242. In this configuration of the lid assembly 214, the remote plasma source 224 may not be used, or not be installed within the lid assembly 214.

A central conduit 270, which is formed in fourth plate 250, is adapted to provide the plasma generated species provided from the volume 248 through a fifth plate 254 to the mixing chamber 266 formed in a sixth plate 268 of the lid assembly 214. The central conduit 270 communicates with the mixing chamber 266 through an opening 264 in the fifth plate 254. The opening 264 may have a diameter less than, greater than or the same as a diameter of the central conduit 270. In the embodiment of FIG. 2B, the opening 264 has diameter the same as the central conduit 270.

The fourth plate 250 also includes a plurality of inlets 256 and 258 that are configured to provide gases to the mixing chamber 266. The inlet 256 is coupled to a first gas source 260 and the inlet 258 is coupled to a second gas source 262. The first gas source 260 and the second gas source 262 may include processing gases as well as inert gases, for example noble gases such as argon and/or helium, utilized as a carrier gas. The first gas source 260 may include ammonia (NH$_3$) as well as argon. The second gas source 262 may contain fluorine containing gases, hydrogen containing gases, or a combination thereof. In one example, the second gas source 262 may contain hydrogen fluoride (HF) as well as argon.

As illustrated in FIG. 2B, in some configurations, the inlet 256 is coupled to the mixing chamber 266 through a cylindrical channel 259 and a plurality of holes 265 formed in the plate 254. The inlet 258 is coupled to the mixing chamber 266 through a cylindrical channel 257 and a plurality of holes 267 formed in the fifth plate 254. The holes 265, 267 formed in the plate 254 are generally sized so that they enable a uniform flow of gases, which are provided from their respective gas source 260, 262, into the mixing chamber 266. In one configuration, the openings 267 have a diameter that is less than a width of the opening defined by the opposing sidewalls of the cylindrical channel 257 formed fourth plate 250. The openings 267 are typically distributed around the circumference of the center-line of the cylindrical conduit 257 to provide uniform fluid flow into the chamber 266. In one configuration, the holes 265 have a diameter that is less than a width of the opening defined by the opposing sidewalls of the cylindrical channel 259 formed fourth plate 250. The holes 265 are typically distributed around the circumference of the center-line of the cylindrical conduit 259 to provide uniform fluid flow into the chamber 266.

The inlets 256 and 258 provide respective fluid flow paths laterally through the fourth plate 250, turning toward and penetrating through the fifth plate 254 to the mixing chamber 266. The lid assembly 214 also includes a seventh plate or first gas distributor 272, which may be a gas distribution plate, such as a showerhead, where the various gases mixed in the lid assembly 214 are flowed through perforations 274 formed therein. The perforations 274 are in fluid communication with the mixing chamber 266 to provide flow pathways from the mixing chamber 266 through the first gas distributor 272. Referring back to FIG. 2A, a blocker plate 228 and a gas distribution plate, such as a second gas distributor 230, which may be a gas distribution plate, such as a showerhead, is disposed below the lid assembly 214.

Alternatively, a different cleaning process may be utilized to clean the substrate surface. For example, a remote plasma containing He and NF$_3$ may be introduced into the processing chamber 200 through the lid assembly 214, while NH$_3$ may be directly injected into the processing chamber 200 via a separate gas inlet 225 that is disposed at a side of the chamber body 212 and coupled to a gas source 261.

The support assembly 216 may include a substrate support 232 to support a substrate 210 thereon during processing. The substrate support 232 may be coupled to an actuator 234 by a shaft 236 which extends through a centrally-located opening formed in a bottom of the chamber body 212. The actuator 234 may be flexibly sealed to the chamber body 212 by bellows (not shown) that prevent vacuum leakage around the shaft 236. The actuator 234 allows the substrate support 232 to be moved vertically within the chamber body 212 between a processing position and a loading position. The loading position is slightly below the opening of a tunnel (not shown) formed in a sidewall of the chamber body 212.

The substrate support 232 has a flat, or a substantially flat, substrate supporting surface for supporting a substrate to be processed thereon. The substrate support 232 may be moved vertically within the chamber body 212 by actuator 234, which is coupled to the substrate support 232 by shaft 236. For some steps, the substrate support 232 may be elevated to a position in close proximity to the lid assembly 214 to control the temperature of the substrate 210 being processed. As such, the substrate 210 may be heated via radiation emitted from the second gas distributor 230, or another radiant source, or by convection or conduction from the second gas distributor 230 through an intervening gas. In some process steps, the substrate may be disposed on lift pins 251 to perform additional thermal processing steps, such as performing an annealing step.

Figure 2C:
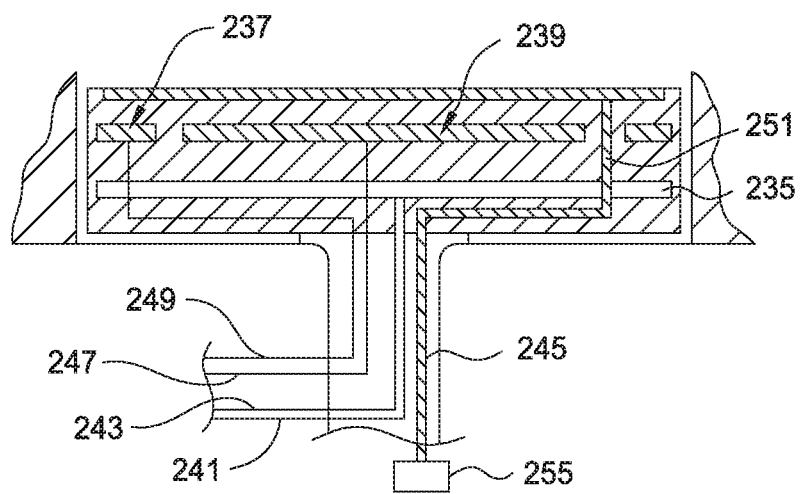
FIG. 2C is a cross-sectional detail view of a substrate support according to one embodiment.

FIG. 2C is a cross-sectional detail view of the substrate support 232. The substrate support 232 includes a thermal control plenum 235 in fluid communication with a fluid supply conduit 241 and a fluid return conduit 243, each of the conduits 241 and 243 disposed through the shaft 236. The thermal control plenum 235 may be a cooling feature for the substrate support 232 by circulating a cooling fluid through the fluid supply conduit 241, into the thermal control plenum 235, and out through the fluid return conduit 243.

The substrate support 232 may also include a plurality of heaters 237 and 239. The plurality of heaters, in this embodiment, includes a first heater 237 and a second heater 239. The first and second heaters 237 and 239 are disposed in a substantially coplanar relationship within the substrate support 232 at a location to enable thermal coupling between the heaters and the substrate supporting surface. The first heater 237 is disposed at a periphery of the substrate support 232, and the second heater 239 is disposed in a central area of the substrate support 232, to provide zonal temperature control. Each of the first and second heaters 237 and 239 may be resistive heaters that are coupled to power sources (not shown) by respective power conduits 249 and 247, each disposed through the shaft 236.

In operation, temperature control may be provided by concurrent operation of the thermal control plenum 235 and the heaters 237 and 239. The thermal control plenum 235 may be supplied with a cooling fluid, as described above, and power may be provided to the heaters 237 and 239, as resistive heaters. In this way, separate control circuits may be tuned to provide fast response for one item, for example the heaters 237 and 239, and slower response for the thermal control plenum 235, or vice versa. At a minimum, different control parameters may be applied to the thermal control plenum 235, the first heater 237, and the second heater 239 to accomplish an optimized, zonal temperature control system.

As shown in FIG. 2C, a separate lift member 245 may be included in the support assembly 216. A recess (not shown) may be provided in the substrate supporting surface to accommodate the lift pins 251 of the member 245 when the substrate rests on the substrate supporting surface. The lift member 245 may be coupled to a lift actuator 255 by an extension of the lift member 245 disposed through the shaft 236. The lift actuator may move the lift member 245 vertically to lift the substrate off the substrate supporting surface toward the first gas distributor 272. The lift member 245 may be a hoop, such as an open hoop or a closed hoop, which may be U-shaped, circular, horseshoe-shaped, or any convenient shape. The lift member 245 has a thickness to provide structural strength when lifting a substrate. In one example, the lift member is made of a ceramic material and is about 1 mm thick.

Figure 3:
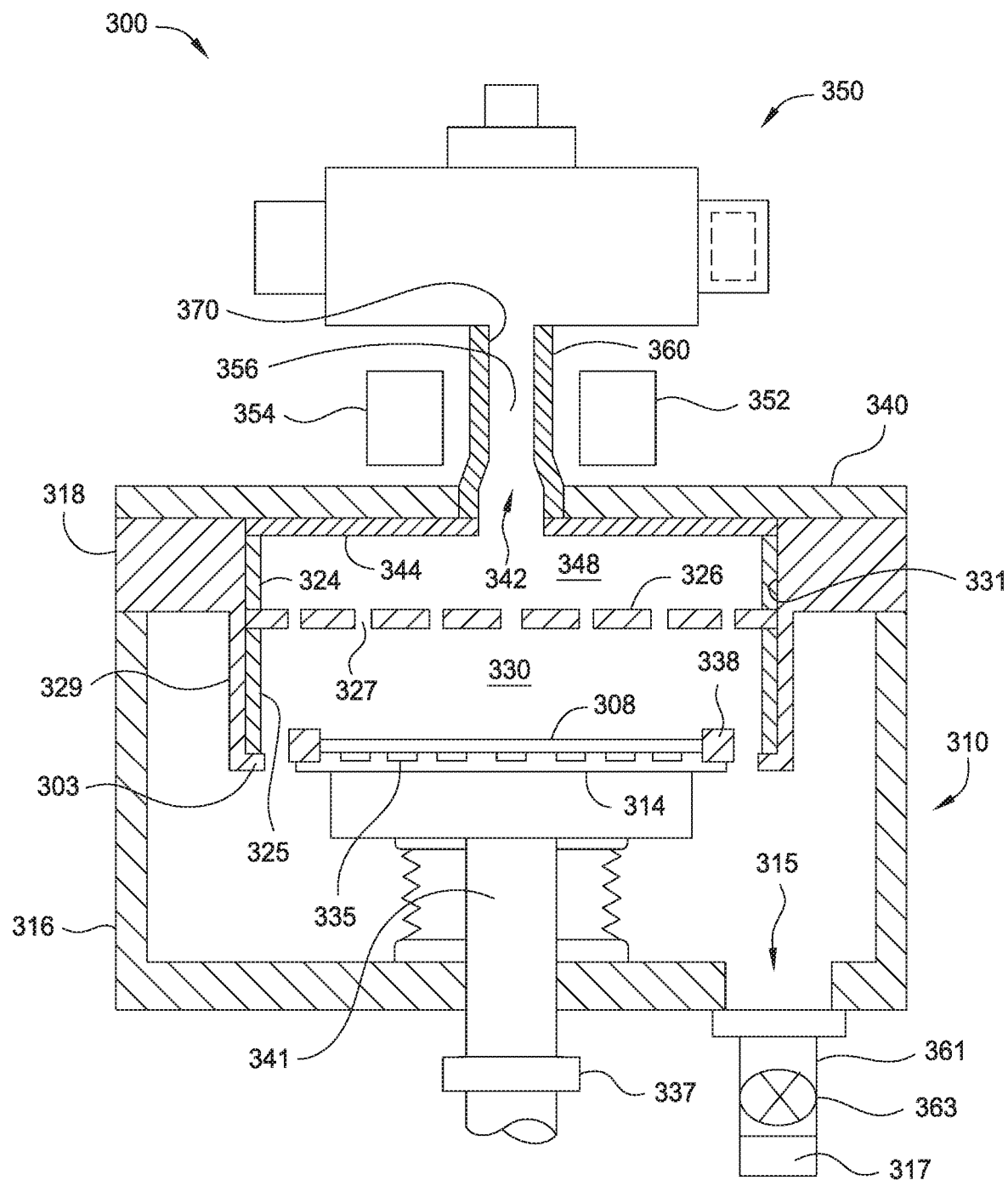
FIG. 3 is a cross-sectional view of a cleaning chamber used to perform a reducing process of FIG. 1 in accordance with one implementation of the present disclosure.

FIG. 3 is a cross sectional view of a processing chamber 300 that can be used to perform at least some of the processes found in box 104, and thus removes contaminants, such as carbon or hydrocarbons accumulated on a surface of a substrate. The processing chamber 300 has a chamber body 310, which includes a chamber enclosure 316, a process kit housing 318, and a lid 340. The chamber enclosure 316 and the lid 340 may be fabricated from aluminum, stainless steel or other suitable materials. The process kit housing 318 may be fabricated from aluminum alloy or other suitable materials. The lid 340 is removably coupled to the chamber enclosure 316 through the process kit housing 318.

The process kit housing 318 may be a ring-shaped housing having a top surface that couples to the lid 340 and a bottom surface that couples to the chamber enclosure 316. The process kit housing 318 has a shield portion 329 extending down from an inner surface 331 of the process kit housing 318. The inner surface 331 of the process kit housing 318 surrounds and supports a gas distribution plate 326 thereon. The gas distribution plate 326 may be a quartz showerhead. A plenum 348 is defined between the gas distribution plate 326 and the lid 340. The gas distribution plate 326 includes a plurality of apertures 327 formed through the thickness of the gas distribution plate 326 to allow gases flowing into the plenum 348 through a port 342. In some configurations, the gases provided from the RPS 350 flow through 342 to 348. The apertures 327 in the gas distribution plate 326 then allow gases to flow into the processing region 330 which contains the substrate 308. The apertures 327 are evenly distributed across the diameter of the gas distribution plate 326 to ensure uniform distribution of the gases or radicals to the substrate 308. The gases flowing through the apertures 327 are distributed across the substrate 308 disposed in a process region 330 defined between the gas distribution plate 326 and a heater 314. The shield portion 329 also helps confine electrically neutral radicals within the process region 330. In one example, the shield portion 329 is extended to a location adjacent or below the edge of the heater 314 when the substrate is in the process position.

The processing chamber 300 includes a remote plasma source 350 that is coupled to the port 342 by a conduit 360. The port 342 is formed in the lid 340. The conduit 360 defines a passage 356, which may have a first inner diameter and a second inner diameter that is larger than the first inner diameter. The first inner diameter may be disposed adjacent to the remote plasma source 350 and the second inner diameter may be disposed adjacent to the lid 340. In one example, first inner diameter may be about 12 mm to about 50 mm, for example about 20 mm, and the second inner diameter may be about 35 mm to about 60 mm, for example about 40 mm.

The conduit 360 is configured to filter ions generated in the remote plasma source 350 before entering the process region 330, while allowing electrically neutral radicals to enter the process region 330. The relative concentration of ions in the process region 330 is thus reduced. In one implementation, the gases flowing through the passage 356 are filtered by a magnetic field generated by one or more magnets disposed adjacent to the passage tube 360. The magnets generate a magnetic field across the conduit 360 to filter charged particles entrained with the reactive radicals flowing from the remote plasma source 350.

In the implementation depicted in FIG. 3, a first magnet 352 and a second magnet 354 are disposed adjacent to the conduit 360. The first magnet 352 and second magnet 354 may be permanent magnets or electromagnets. The magnets 352, 354 may be disposed opposite from each other across the first inner diameter of the conduit 360. For example, the magnets 352, 354 may be adhered or secured on opposite sides of an outer periphery of the conduit 360. The magnets 352, 354 may alternately be secured to the chamber lid 340 or other components of the chamber body 310. The relative distance between the opposed magnet and the passage 356 formed within the passage tube 360 affects the strength of the magnetic field passing through the passage 356, and thereby affects the filtering efficiency. The magnetic field may also be adjusted by using different magnets, i.e., replacing magnets 352, 354 with different strength. The passing charged particles are drawn in contact with an inner surface 370 of the conduit 360 and become electrically neutral, non-ionic species. As such, the filtered, electrically neutral radicals are delivered to the surface of the substrate to react with and clean contaminants thereon.

Alternately, in some embodiments, the first magnet 352 and the second magnet 354 are replaced by a single ring magnet that is disposed around the conduit 360. The single ring magnet may be a permanent magnet or an electromagnet.

In some implementations, a quartz containing surfaces are positioned to cover the flow path of the process gases (i.e., radicals and ions) passing into the chamber body 310. For example, the inner surface 370 of the conduit 360 defining the passage 356 may be entirely or partially coated or fabricated from quartz. In one configuration, the surfaces defining the plenum 348 and/or gas distribution plate 326 may also be entirely or at least partially coated or fabricated from quartz. For example, in the implementation of FIG. 3, a top liner 324 may be disposed along the inner surface 331 of the process kit housing 318. The top liner 324 may have a ring-shaped body surrounding the plenum 348, an inner surface thereof defining the outer boundary of the plenum 348. The top liner 324 may be made of quartz. The top liner 324 may rest on the gas distribution plate 326, or may be supported by any other suitable securing approach.

A liner plate 344 may be disposed along the bottom surface of the lid 340. The liner plate 344 may be coated with, or fabricated from, quartz. The liner plate 344 defines the upper boundary of the plenum 348. Therefore, the liner plate 344, the top liner 324, and the gas distribution plate 326 define the plenum 348. A bottom liner 325 may be disposed along the inner surface 331 of the process kit housing 318. The bottom liner 325 may have a ring-shaped body, and surrounds the process region 330 when assembled for operation, an inner surface thereof defining the outer boundary of the process region 330. The bottom liner 325 may be coated with, or fabricated from, quartz. The bottom liner 325 may be supported by the shield portion 329. In one example as shown, a ledge 303 extends radially inward at an end of the shield portion 329 to support the bottom liner 325. Therefore, the conduit 360, the liner plate 344, the top liner 324, the bottom liner 325, and the gas distribution plate together provide a quartz surface along the flow path of the process gases.

A substrate support 314 is disposed in the process region 330 of the chamber body 310. The substrate support 314 is coupled to a bottom of the chamber enclosure 316 through a central shaft 341. The substrate support 314 has a substrate supporting surface for supporting the substrate 308 thereon during a process, such as the processes described above with respect to boxes 102 and 104. An optional focus ring 338 may be disposed on the substrate support 314 around the outer periphery of the substrate supporting surface. The focus ring 338 confines plasma or neutral species in an area above the substrate 308 during processing. The focus ring 338 may be fabricated from quartz.

The substrate support 314 may be fabricated from aluminum with a plurality of sapphire contacts (not shown) disposed on the substrate supporting surface to minimize contact between the substrate supporting surface and a substrate disposed on the sapphire contacts. The substrate support 314 is actuated by a driving unit 337 to move vertically between a loading position and a processing position. The substrate support 314 may have one or more heating elements 335 embedded therein to provide uniform thermal energy to the substrate supporting surface. Suitable heating elements 335 may include resistive heaters, thermoelectric devices, or conduits for flowing heat transfer fluid, among other heating devices. The heating elements 335 allow the temperature of the substrate 308 to be maintained at a temperature range of about 25° C. to about 500° C., for example about 300° C. to about 350° C., about 350° C. to about 450° C., or about 450° C. to about 500° C. In some implementations, the heater 314 may have cutouts formed through the peripheral edge of the substrate supporting surface so that a substrate handler (not shown) can pick-up or drop-off a substrate 308 from lift pins (not shown) when the substrate support 314 is positioned at the loading position. During the cleaning process (box 102), for example, the substrate support 314 and substrate 308 are positioned at a processing position, which is disposed above the loading position and closer to the gas distribution plate 326.

The processing chamber 300 includes a pump 317. The pump 317 is connected to the chamber body 310 through a foreline 361. The foreline 361 connects to the chamber body 310 at an opening 315 formed at the bottom of the enclosure 316. The chamber 300 also includes a throttle valve 363 disposed in the foreline 361. The throttle valve 363 is configured to open and close to whatever extent is necessary to maintain a desired vacuum pressure in the processing chamber 300 during processing. The pump 317 and the throttle valve 363 control the pressure inside the chamber body 310 from between about 0.005 Torr and 750 Torr, for example about 40 Torr to about 500 Torr. In one example, the pump 317 is a dry pump that maintains the pressure inside the processing chamber 300 at an exemplary pressure range of about 0.1 Torr to about 40 Torr, for example about 30 Torr. In one example, the pump 317 is a low pressure pump that maintains the pressure inside the processing chamber 300 at an exemplary pressure range of about 100 mTorr to about 500 mTorr, for example about 150 mTorr. In some examples, the pump 317 is a turbo pump that maintains the pressure inside the processing chamber 300 at an exemplary pressure range of about 20 mTorr to 500 mTorr.

Figure 4:
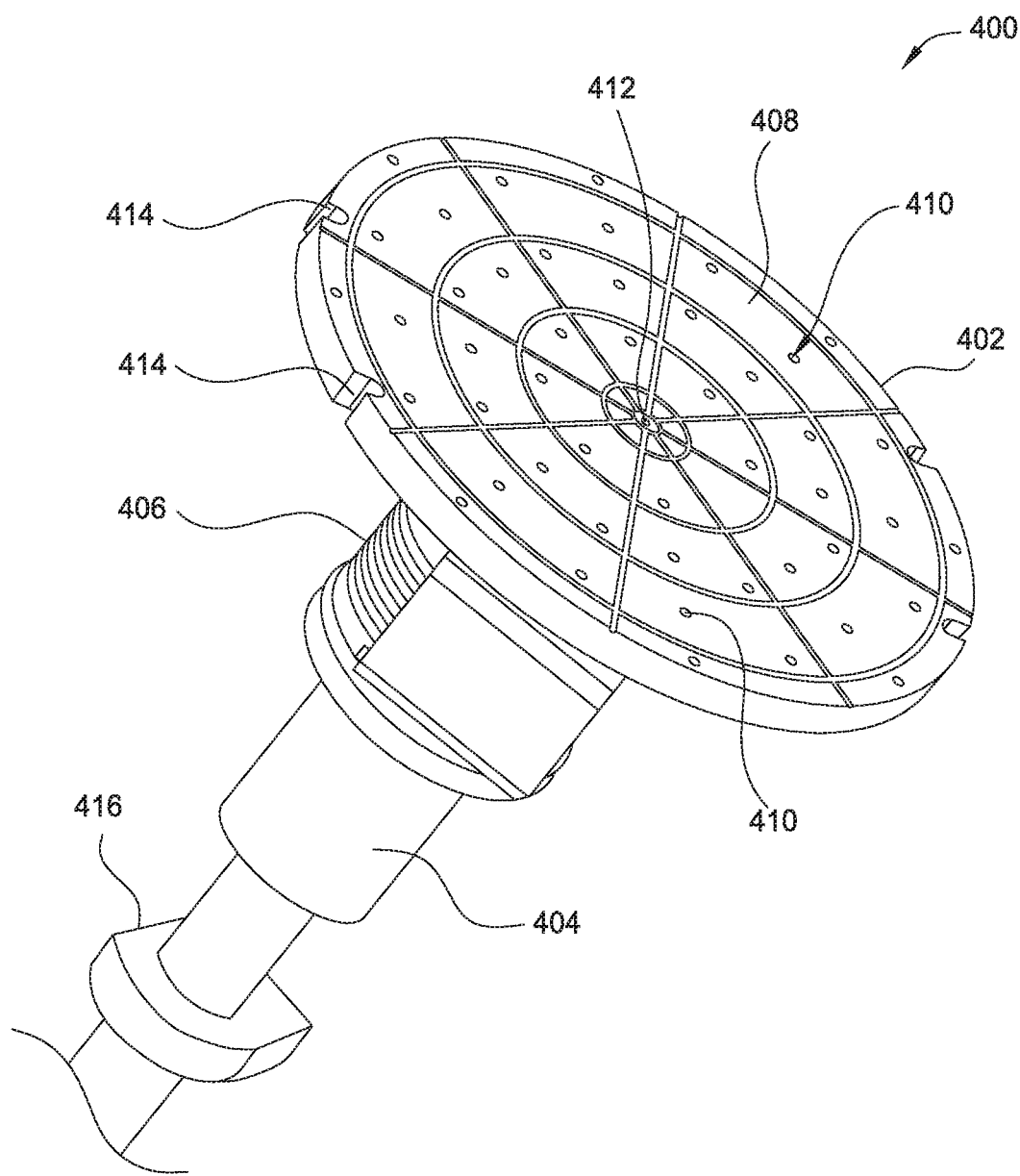
FIG. 4 is a perspective view of a substrate support that may be disposed within a substrate processing chamber, such as a processing chamber having a remote plasma source.

FIG. 4 is a perspective view of a substrate support 400 that may be disposed within a substrate processing chamber, such as a processing chamber having a remote plasma source (RPS). The substrate support 400 is an example of the substrate support 314 that is used in the processing chamber 300.

The substrate support 400 generally includes a support body 402 and a shaft 404 coupled to the support body 402, and a bellows 406 disposed around the shaft 404. The bellows 406 is coupled to a bottom of the support body 402 and/or the shaft 404. In one example, the bottom of the bellows 406 is attached in a vacuum-tight manner to a bottom of the substrate processing chamber. A driving unit 416 may be coupled to the shaft 404 to allow vertical motion of the support body 402 relative to the substrate processing chamber. In some implementations, the driving unit 416 may be configured to rotate the shaft 404 and thus the support body 402.

The support body 402 has a substrate supporting surface 408. The support body 402 has one or more heating elements 520 (see FIG. 5) embedded or contained therein to provide uniform thermal energy to a substrate to be disposed on the substrate supporting surface 408 during a process, such as a plasma cleaning process. The heating elements 520 may be arranged in an azimuthally symmetric pattern to ensure uniform heating of the substrate. Suitable heating elements may include resistive heaters, thermoelectric devices, or conduits for flowing heat transfer fluid, among other heating devices. In one example, the heating elements are resistive heating coils. The heating elements allow the temperature of the substrate to be maintained at a temperature range of about 25° C. to about 650° C., or greater, for example about 300° C. to about 350° C., about 350° C. to about 450° C., about 450° C. to about 550° C., about 550° C. to about 650° C., or higher.

The substrate supporting surface 408 has a plurality of contact points 410 on which the substrate rests during processing in the substrate processing chamber. The contact points 410 are distributed over the substrate supporting surface 408. In one implementation, the contact points 410 are arranged in concentric circles about a central point 412 of the support body 402. Additionally or alternatively, the contact points 410 may be arranged in an azimuthally symmetric pattern to ensure uniform processing of the substrate. The contact points 410 may be in the form of protrusions or bumps. The protrusions or bumps provide minimized contact surface area to prevent the substrate from directly contacting the substrate supporting surface 408. In one implementation, the contact points 410 are sapphire balls.

The support body 402 may have a plurality of cutouts 414 disposed at the peripheral edge of the support body 402. The cutouts are formed through the entire thickness of the support body, i.e., from the substrate supporting surface 408 to a backside of the support body 402. The cutouts 414 may be equally spaced apart around the periphery of the support body 402. In one embodiment, four cutouts 414 are disposed symmetrically at the peripheral edge of the support body 402. The cutouts 414 are sized so that a substrate handler (not shown) can pick-up or drop-off a substrate from lift pins (not shown) when the support body 402 is positioned at the loading position.

The support body 402 may be fabricated from ceramic, aluminum, or other suitable material, such as aluminum nitride. The shaft 404 may be fabricated from a metal (e.g., aluminum) or a ceramic material, such as aluminum nitride, aluminum oxide, or doped ceramics such as alumina doped with titanium nitride or chromium nitride, doped aluminum oxide, doped boron-nitride and the like. In one embodiment, the shaft 404 is formed from about 95% pure aluminum nitride. In one embodiment, the shaft 404 and the support body 402 may be fabricated from the same material.

Figure 5:
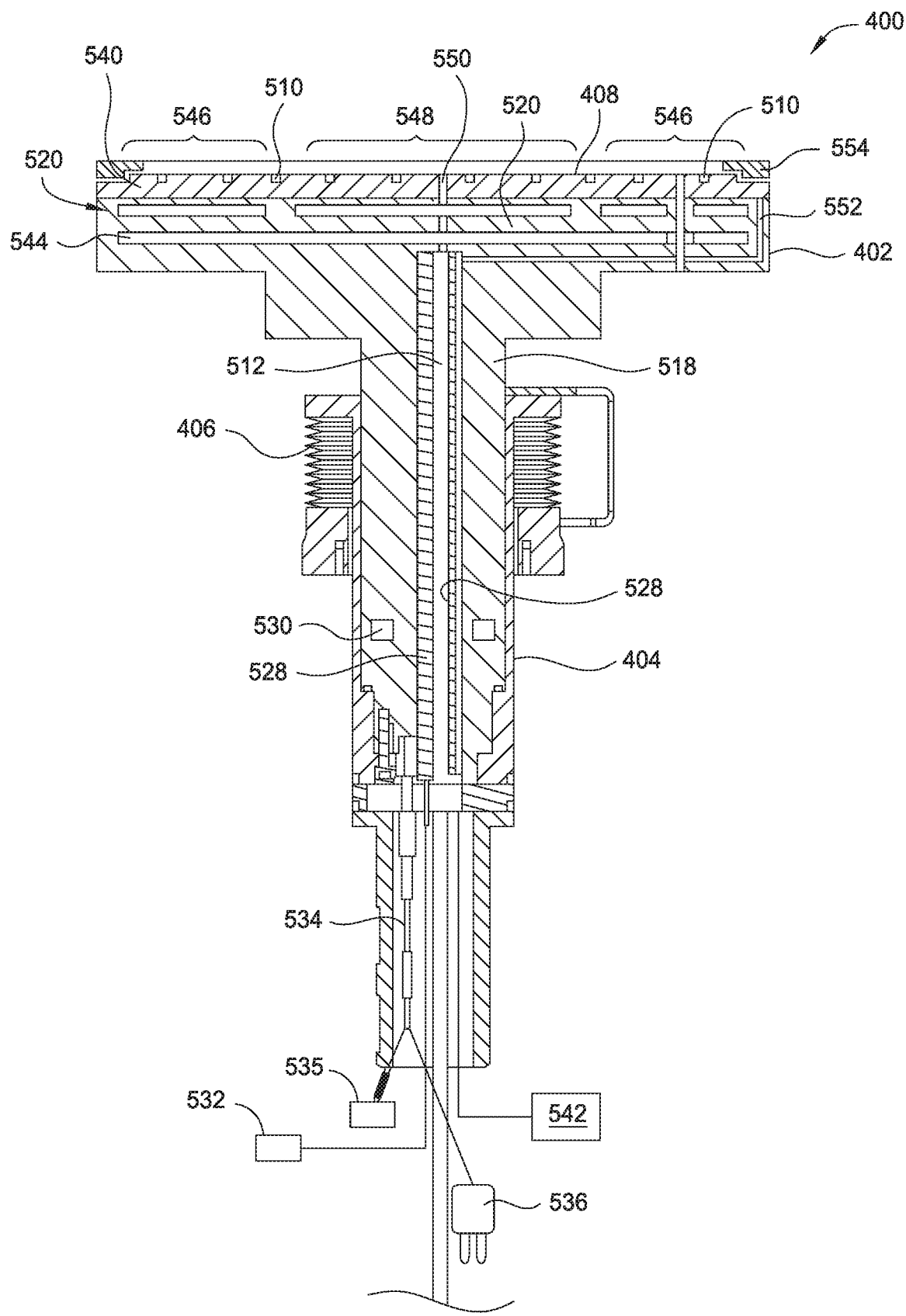
FIG. 5 is a cross-sectional view of a portion of the substrate support of FIG. 4, according to an embodiment of the disclosure provided herein.

FIG. 5 is a cross-sectional view of a portion of the substrate support 400 of FIG. 4. One implementation of the support body 402 has a plurality of cavities 510 formed in the substrate supporting surface 408 for receiving contact points 410, such as sapphire balls. Another version of the support body has the contact points machined directly into the surface of the support body 402 such that the support body and contact points are an integral piece of material. A third version of the support body has the contact points deposited on the support body through a deposition process such as a CVD, PVD, or evaporative deposition process. The shaft 404 is hollow having a sidewall 518 defining a central opening 512 therein. The central opening 512 allows for a power line 528 to pass through. One end of the power line 528 is connected the one or more heating elements 520, while the other end of the power line 528 is connected to a heating power source 532, such as a DC or AC power source.

The shaft 404 may include a channel 530 connecting to a cooling fluid source (not shown). The channel 530 may be disposed within any desired location of the shaft 404 for circulating a cooling fluid from the cooling fluid source to control the temperature of the shaft 404, and thus the support body 402 and the temperature of the substrate placed thereon during a process.

The substrate support 400 may include a thermocouple 534 disposed in the substrate support 400 to measure a temperature, such as the temperature of the substrate support 400, the substrate supporting surface 408, or the temperature of the substrate when disposed on the substrate supporting surface 408. The thermocouple 534 may be any suitable thermocouple design, such as a thermocouple probe or the like. The thermocouple 534 may be coupled to a temperature controller 535, which may control the power supply 536 based on the temperature measured by the thermocouple 534.

In some embodiments, the heating elements 520 comprise a multi zone heater that includes an outer zone 546 and an inner zone 548 that may be controlled independently. A purge gas inlet 550 and outlet 552 may be provided in the substrate support 400. The inlet 550 and outlet 552 may be utilized to supply a backside gas to a substrate on the substrate supporting surface 408. The gas channel 552 may also be connected to a vacuum pump or low pressure region in order to create a pressure differential between the front and backside of the substrate to hold the substrate to the pedestal surface 408. In some embodiments, an edge ring 554 may be provided over the substrate supporting surface 408.

Figure 6:
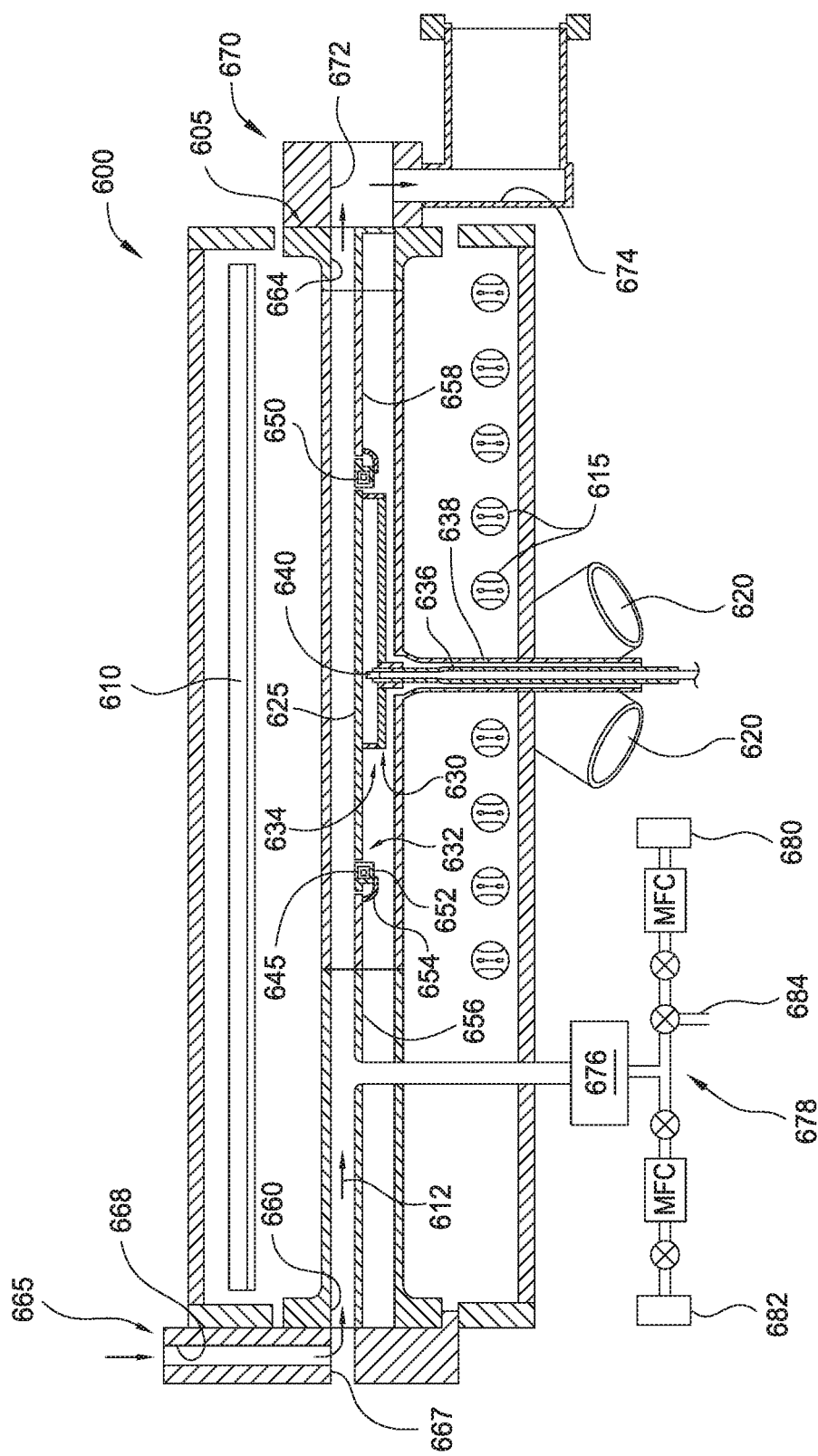
FIG. 6 illustrates single substrate chemical vapor deposition (CVD) reactor for performing an epitaxial deposition process.

FIG. 6 illustrates single substrate chemical vapor deposition (CVD) reactor 600, including a quartz process or reaction chamber 605, according to one embodiment. The reactor 600 may be utilized for CVD of a number of different materials, including SiGe and Ge films as disclosed herein. Moreover, the illustrated reactor 600 can accomplish multiple deposition steps in the same chamber 605, as will be apparent from the discussion below.

The chamber 600 may generally have the shape of a rectangular box. A plurality of radiant heat sources is supported outside the chamber 605 to provide heat energy in the chamber 605 without appreciable absorption by walls of the quartz chamber 605. While the embodiments are described in the context of a "cold wall" CVD reactor for processing semiconductor substrates, it will be understood that the methods described herein will have utility in conjunction with other heating/cooling systems, such as those employing inductive or resistive heating.

The radiant heat sources comprise an upper heating assembly of elongated tube-type radiant heating elements 610. The upper heating elements 610 are preferably disposed in spaced-apart parallel relationship and also substantially parallel with a reactant gas flow path (shown by arrow 612) through the reaction chamber 605. A lower heating assembly comprises similar elongated tube-type radiant heating elements 615 positioned below the reaction chamber 605, and oriented transverse to the upper heating elements 610. A portion of the radiant heat is diffusely reflected into the chamber 605 by rough specular reflector plates (not shown) above and below the upper and lower lamps 610, 615, respectively. Additionally, a plurality of spot lamps 620 supply concentrated heat to the underside of the substrate support structure (described below), to counteract a heat sink effect created by cold support structures extending through the bottom of the reaction chamber 605. Each of the elongated tube type heating elements 610, 615 is preferably a high intensity tungsten filament lamp producing radiant heat energy transmitted through the walls of the reaction chamber 605 without appreciable absorption. As is known in the art of semiconductor processing equipment, the power of the various lamps 610, 615, 620 can be controlled independently or in grouped zones in response to temperature sensors.

A workpiece, comprising a silicon substrate 625, is shown supported within the reaction chamber 605 upon a substrate support structure 630. The illustrated support structure 630 includes a substrate holder 632, upon which the substrate 625 rests, and a support spider 634. The spider 634 is mounted to a shaft 636, which extends downwardly through a tube 638 extending through the chamber lower wall. The tube 638 communicates with a source of purge gas which can flow during processing of a substrate. The purge gas may be utilized to inhibit process gases from entering the lower section of the chamber 605. The purge gas may also flow horizontally beneath the substrate 625.

A plurality of temperature sensors is positioned in proximity to the substrate 625. The temperature sensors may take a variety of forms, such as optical pyrometers or thermocouples. In the illustrated embodiment, the temperature sensors comprise thermocouples, including a first or central thermocouple 640, suspended below the substrate holder 632 in any suitable fashion. The central thermocouple 640 passes through the spider 634 in proximity to the substrate holder 632. The reactor 600 further includes a plurality of secondary or peripheral thermocouples, also in proximity to the substrate 625, including a leading edge or front thermocouple 645, a trailing edge or rear thermocouple 650, and a side thermocouple (not shown). Each of the peripheral thermocouples is housed within a slip ring 652, which surrounds the substrate holder 632 and the substrate 625. Each of the central and peripheral thermocouples are connected to a temperature controller, which sets the power of the various heating elements 610, 615, 620 in response to the readings of the thermocouples.

In addition to housing the peripheral thermocouples, the slip ring 652 absorbs and emits radiant heat during high temperature processing. The slip ring 652 may be utilized to compensate for a greater heat loss or absorption at the substrate edges, a phenomenon which is known to occur due to a greater ratio of surface area to volume in regions near the substrate edges. By minimizing edge losses, slip ring 652 can reduce the risk of radial temperature non-uniformities across the substrate 625. The slip ring 652 can be suspended by any suitable means. For example, the illustrated slip ring 652 rests upon support members 654, which extend from a front chamber divider 656, and a rear chamber divider 658. The dividers 656, 658 desirably are formed of quartz. In some arrangements, the rear divider 658 can be omitted.

The illustrated reaction chamber 605 includes an inlet port 660 for the injection of reactant and carrier gases, and the substrate 625 can also be received therethrough. An outlet port 664 is on the opposite side of the chamber 605, with the substrate support structure 630 positioned between the inlet 660 and outlet 664.

An inlet component 665 is fitted to the reaction chamber 605, adapted to surround the inlet port 660, and includes a horizontally elongated slot 667 through which the substrate 625 can be inserted. A generally vertical inlet 668 receives gases from gas sources and communicates such gases with the slot 667 and the inlet port 660. While not separately illustrated in FIG. 6, the gas sources may include hydrogen, silicon and germanium precursors, and a controller (e.g., preprogrammed computer) that controls a sequence of steps as described herein, including flowing the surface active compound into the chamber during a cool down step prior to Si and/or Ge deposition. The inlet 668 can include gas injectors designed to maximize uniformity of gas flow for the single-substrate reactor.

An outlet component 670 similarly mounts to the process chamber 605 such that an exhaust opening 672 aligns with the outlet port 664 and leads to exhaust conduits 674. The conduits 674, in turn, can communicate with suitable vacuum means (not shown) for exhausting process gases from the chamber 605. In one embodiment, process gases are drawn through the reaction chamber 605 and a downstream scrubber (not shown). A pump or fan is preferably included to aid in drawing process gases through the chamber 605, and to evacuate the chamber for reduced pressure processing, i.e., below atmospheric pressure but above ultra-high vacuum pressure ranges, as discussed below.

The illustrated reactor 600 also includes a source 676 of excited species, positioned upstream from the chamber 600. The excited species source 676 of the illustrated embodiment comprises a remote plasma generator, along a gas line 678. In the illustrated embodiment, microwave energy from the RPS energy source is coupled to a flowing gas in an applicator along the gas line 678. A source of precursor gases 680 is coupled to the gas line 678 for introduction into the excited species source 676. A source of carrier gas 682 is also coupled to the gas line 678. One or more branch lines 684 can also be provided for additional reactants. As is known in the art, the gas sources 680, 682 can comprise gas tanks, bubblers, etc., depending upon the form and volatility of the reactant species. Each gas line can be provided with a separate mass flow controller (MFC) and valves, as shown, to allow selection of relative amounts of carrier and reactant species introduced to the source 676 and thence into the reaction chamber 605. The excited species source 676 can be employed for plasma enhanced deposition, but also may be utilized for exciting etchants for cleaning the chamber 605 of excess deposition when no substrate is in the chamber 605.

The total volume capacity of the single-substrate process chamber 605 designed for processing 200 mm substrates, for example, is less than about 30 liters, such as less than about 20 liters, and in one embodiment is less than about 10 liters. The illustrated chamber 605 has a capacity of about 7.5 liters. Because the illustrated chamber 605 is partitioned by the dividers 656, 658, substrate holder 632, ring 652, and the purge gas flowing from the tube 638, the effective volume through which process gases flow is around half the total volume (e.g., about 3.77 liters in the illustrated embodiment). It is understood that the volume of the single-substrate process chamber 605 can be different, depending upon the size of the substrates for which the chamber 605 is designed to accommodate. For example, a single-substrate processing chamber 605 for 300 mm substrates has a capacity of less than about 100 liters, such as about 60 liters, and in one embodiment is less than about 30 liters. In one example, the single-substrate processing chamber 605 for processing a 300 mm substrate has a total volume of about 24 liters, with an effective volume of about 12 liters.

Deposition temperatures for a Ge-containing layer are typically in the range of about 250 degrees Celsius (C) to about 600 degrees C., for example about 300 degrees C. to about 450 degrees C. For example, lower deposition temperatures tend to be more appropriate as the thermal stability of the precursor decreases. The total pressure in the single-substrate processing chamber 605 is in the range of about 10-5 Torr to about 800 Torr. In some embodiments, the pressure is about 200 mTorr to about 760 Torr, such as about 1 Torr to about 200 Torr, for example about 1 Torr to about 60 Torr.

Figure 7:
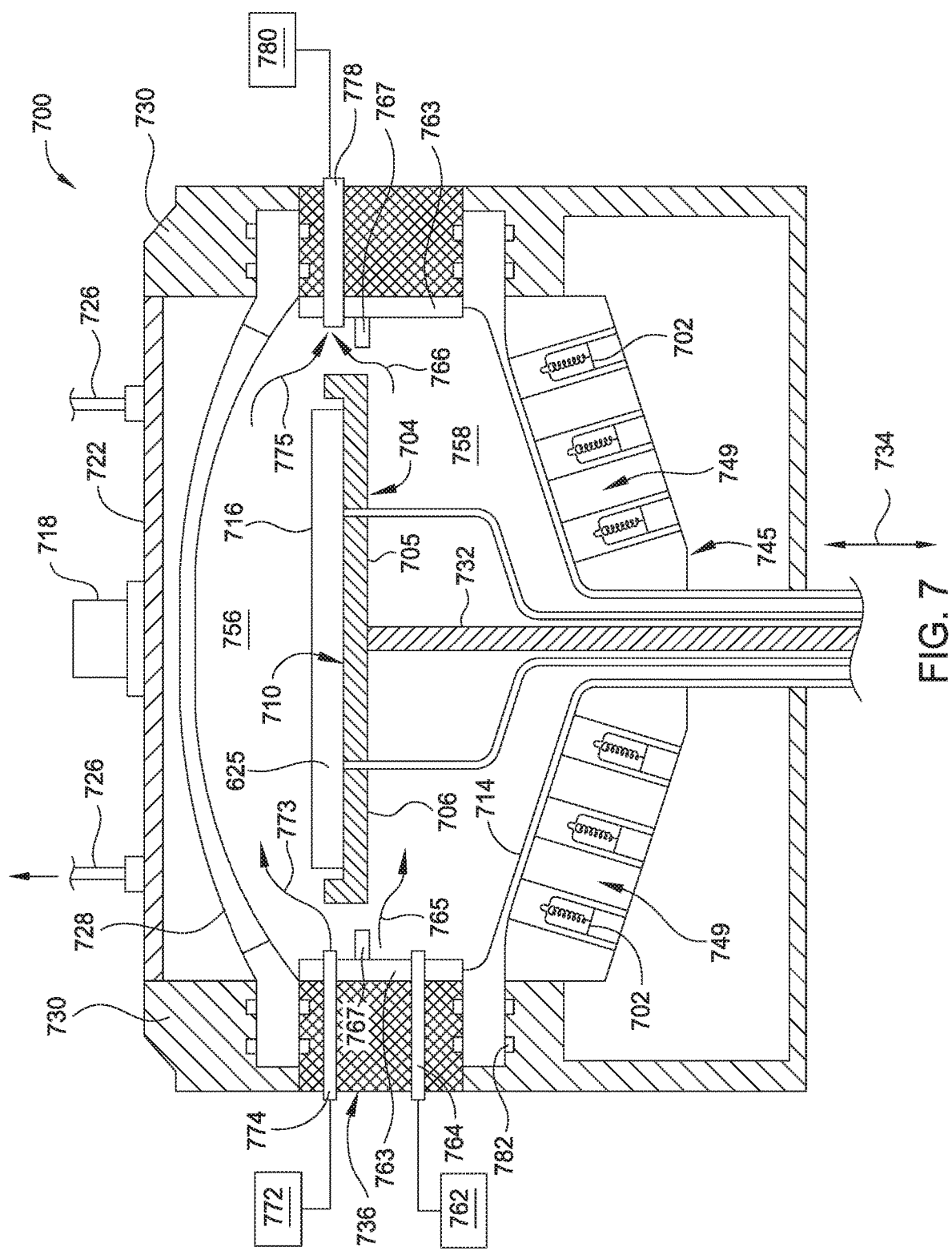
FIG. 7 illustrates a schematic sectional view of a backside heating process chamber for performing an epitaxial deposition process.

FIG. 7 illustrates a schematic sectional view of a backside heating process chamber 700 configured for low pressure epitaxial deposition according to one embodiment. The process chamber 700 may be used to process one or more substrates, including the deposition of a material on an upper surface of a substrate 625. The process chamber 700 may include an array of radiant heating lamps 702 for heating, among other components, a back side 704 of a substrate support 706 disposed within the process chamber 700. The substrate support 706 may be a disk-like substrate support 706 as shown, or may be a ring-like substrate support (having a central opening), which supports the substrate from the edge of the substrate to facilitate exposure of the substrate to the thermal radiation of the lamps 702.

The substrate support 706 is located within the process chamber 700 between an upper dome 728 and a lower dome 714. The upper dome 728, the lower dome 714 and a base ring 736 that is disposed between the upper dome 728 and lower dome 714 generally define an internal region of the process chamber 700. The substrate 625 (not to scale) is transferred into the process chamber 700 and positioned onto the substrate support 706 through a loading port 103 not shown in this view.

The substrate support 706 is supported by a central shaft 732, which moves the substrate 625 in a vertical direction 734 during loading and unloading, and in some instances, processing of the substrate 625. The substrate support 706 is shown in an elevated processing position in FIG. 7, but may be vertically traversed by an actuator (not shown) coupled to the central shaft 732 to a loading position below the processing position. When lowered below the processing position, lift pins 705 contact the substrate 625 and raise the substrate 625 from the substrate support 706. A robot (not shown) may then enter the process chamber 700 to engage and remove the substrate 625 therefrom though the loading port. The substrate support 706 then may be actuated vertically to the processing position to place the substrate 625, with its device side 716 facing up, on a front side 710 of the substrate support 706.

The substrate support 706, while located in the processing position, divides the internal volume of the process chamber 700 into a process gas region 756 that is above the substrate 625, and a purge gas region 758 below the substrate support 706. The substrate support 706 is rotated during processing by the central shaft 732 to minimize the effect of thermal and process gas flow spatial anomalies within the process chamber 700 and thus facilitate uniform processing of the substrate 625. The substrate support 706 may be formed from silicon carbide or graphite coated with silicon carbide to absorb radiant energy from the lamps 702 and conduct the radiant energy to the substrate 625.

In general, the central window portion of the upper dome 728 and the bottom of the lower dome 714 are formed from an optically transparent material such as quartz. The thickness and the degree of curvature of the upper dome 728 may be configured to provide a flatter geometry for uniform flow uniformity in the process chamber.

The array of lamps 702 can be disposed adjacent to and beneath the lower dome 714 in a specified, optimal desired manner around the central shaft 732 to independently control the temperature at various regions of the substrate 625 as the process gas passes over, which facilitates the deposition of a material onto the upper surface of the substrate 625. While not discussed here in detail, the deposited material may include gallium arsenide, gallium nitride, or aluminum gallium nitride. In some embodiments, an array of radiant heating lamps, such as the lamps 102, may be disposed over the upper dome 728.

The lamps 702 may be configured to include bulbs configured to heat the substrate 625 to a temperature within a range of about 200 degrees C. to about 1600 degrees C. Each lamp 702 is coupled to a power distribution board (not shown) through which power is supplied to each lamp 702. The lamps 702 are positioned within a lamphead 745 which may be cooled during or after processing by, for example, a cooling fluid introduced into channels 749 located between the lamps 702. The lamphead 745 conductively and radiatively cools the lower dome 714 due in part to the close proximity of the lamphead 745 to the lower dome 714. The lamphead 745 may also cool the lamp walls and walls of reflectors (not shown) around the lamps. Alternatively, the lower dome 714 may be cooled by a convective approach. Depending upon the application, the lampheads 745 may or may not be in contact with the lower dome 714.

A circular shield 767 may be optionally disposed around the substrate support 706 and surrounded by a liner assembly 763. The shield 767 prevents or minimizes leakage of heat/light noise from the lamps 702 to the device side 716 of the substrate 625 while providing a pre-heat zone for the process gases. The shield 767 may be made from CVD SiC, sintered graphite coated with SiC, grown SiC, opaque quartz, coated quartz, or any similar, suitable material that is resistant to chemical breakdown by process and purging gases.

The liner assembly 763 is sized to be nested within or surrounded by an inner circumference of the base ring 736. The liner assembly 763 shields the processing volume (i.e., the process gas region 756 and purge gas region 758) from metallic walls of the process chamber 700. The metallic walls may react with precursors and cause contamination in the processing volume. While the liner assembly 763 is shown as a single body, the liner assembly 763 may include one or more liners with different configurations.

As a result of backside heating of the substrate 625 from the substrate support 706, the use of an optical pyrometer 718 for temperature measurements/control on the substrate support can be performed. This temperature measurement by the optical pyrometer 718 may also be done on the device side 716 of the substrate 625, having an unknown emissivity, since heating the substrate front side 710 in this manner is emissivity independent. As a result, the optical pyrometer 718 can only sense radiation from the hot substrate 625 that conducts heat from the substrate support 706, with minimal background radiation from the lamps 702 directly reaching the optical pyrometer 718.

A reflector 722 may be optionally placed outside the upper dome 728 to reflect light that is radiating off the substrate 625 back onto the substrate 625. The reflector 722 may be secured to the upper dome 728 using a clamp ring 730. The reflector 722 can be made of a metal such as aluminum or stainless steel. The efficiency of the reflection can be improved by coating a reflector area with a highly reflective coating such as gold. The reflector 722 can have one or more channels 726 connected to a cooling source (not shown). The channels 726 connect to a passage (not shown) formed on a side of the reflector 722 for cooling the reflector 722. The passage is configured to carry a flow of a fluid such as water and may run horizontally along the side of the reflector 722 in any desired pattern covering a portion or entire surface of the reflector 722.

Process gas supplied from a process gas supply source 772 is introduced into the process gas region 756 through a process gas inlet 774 formed in the sidewall of the base ring 736. The process gas inlet 774 is configured to direct the process gas in a generally radially inward direction. During the film formation process, the substrate support 706 may be located in the processing position, which is adjacent to and at about the same elevation as the process gas inlet 774, allowing the process gas to flow up and round along flow path 773 across the upper surface of the substrate 625 in a laminar flow. The process gas exits the process gas region 756 (along flow path 775) through a gas outlet 778 located on the side of the process chamber 700 opposite the process gas inlet 774. Removal of the process gas through the gas outlet 778 may be facilitated by a vacuum pump 780 coupled thereto. As the process gas inlet 774 and the gas outlet 778 are aligned with each other and disposed approximately at the same elevation, it is believed that such a parallel arrangement, when combined with a flatter upper dome 728 enables a generally planar, uniform gas flow across the substrate 625. Further radial uniformity may be provided by the rotation of the substrate 625 through the substrate support 706.

A purge gas may be supplied from a purge gas source 765 to the purge gas region 758 through an optional purge gas inlet 764 (or through the process gas inlet 774) formed in the sidewall of the base ring 736. The purge gas inlet 764 is disposed at an elevation below the process gas inlet 774. If the circular shield 767 or a pre-heat ring (not shown) is used, the circular shield or the pre-heat ring may be disposed between the process gas inlet 774 and the purge gas inlet 764. In either case, the purge gas inlet 764 is configured to direct the purge gas in a generally radially inward direction. During the film formation process, the substrate support 706 may be located at a position such that the purge gas flows down and round along flow path 765 across the back side 704 of the substrate support 706 in a laminar flow. Without being bound by any particular theory, the flowing of the purge gas is believed to prevent or substantially avoid the flow of the process gas from entering into the purge gas region 758, or to reduce diffusion of the process gas entering the purge gas region 758 (i.e., the region under the substrate support 706). The purge gas exits the purge gas region 758 (along flow path 766) and is exhausted out of the process chamber through the gas outlet 778, which is located on the side of the process chamber 700 opposite the purge gas inlet 764.

Figure 8:
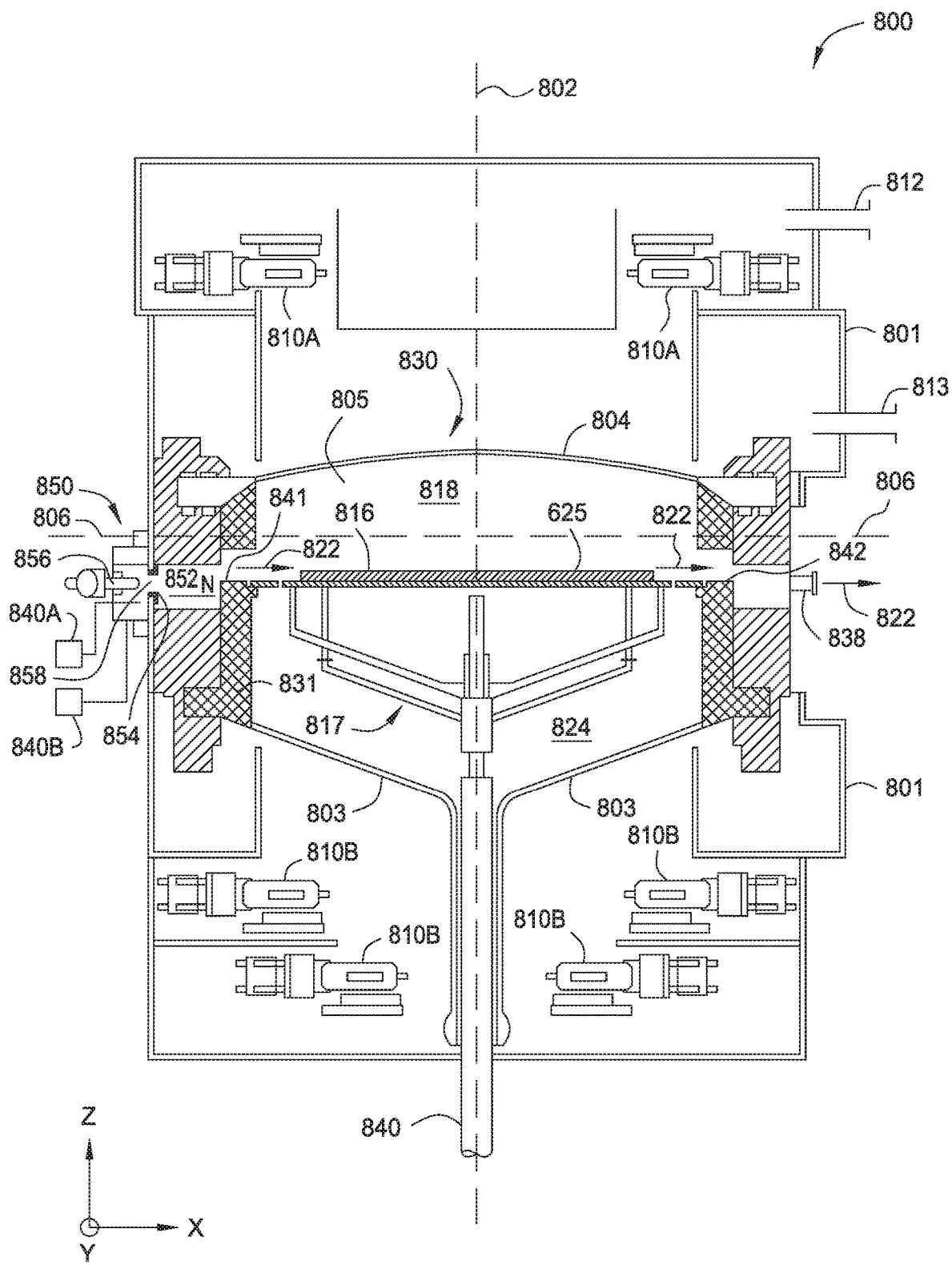
FIG. 8 is a schematic cross-sectional view of a CVD chamber for performing an epitaxial deposition process.

FIG. 8 is a schematic cross-sectional view of a CVD or epitaxial deposition chamber 800, which may be part of a CENTURA® integrated processing system available from Applied Materials, Inc., of Santa Clara, Calif. The deposition chamber 800 includes housing structure 801 made of a process resistant material, such as aluminum or stainless steel, for example 316 L stainless steel. The housing structure 801 encloses various functioning elements of the process chamber 800, such as a quartz chamber 830, which includes an upper chamber 805, and a lower chamber 824, in which a processing volume 818 is contained. Reactive species are provided to the quartz chamber 830 by a gas distribution assembly 850, and processing byproducts are removed from processing volume 818 by an outlet 838, which is typically in communication with a vacuum source (not shown).

A substrate support 817 is adapted to receive a substrate 625 that is transferred to the processing volume 818. The substrate support 817 is disposed along a longitudinal axis 802 of the deposition chamber 800. The substrate support may be made of a ceramic material or a graphite material coated with a silicon material, such as silicon carbide, or other process resistant material. Reactive species from precursor reactant materials are applied to surface 816 of the substrate 625, and byproducts may be subsequently removed from the surface 816. Heating of the substrate 625 and/or the processing volume 818 may be provided by radiation sources, such as upper lamp modules 810A and lower lamp modules 810B.

In one embodiment, the upper lamp modules 810A and lower lamp modules 810B are infrared (IR) lamps. Non-thermal energy or radiation from lamp modules 810A and 810B travels through upper quartz window 804 of upper quartz chamber 805, and through the lower quartz portion 803 of lower quartz chamber 824. Cooling gases for upper quartz chamber 805, if needed, enter through an inlet 812 and exit through an outlet 813. Precursor reactant materials, as well as diluent, purge and vent gases for the chamber 800, enter through gas distribution assembly 850 and exit through outlet 838. While the upper quartz window 804 is shown as being curved or convex, the upper quartz window 804 may be planar or concave as the pressure on both sides of the upper quartz window 804 is substantially the same (i.e., atmospheric pressure).

The low wavelength radiation in the processing volume 818, which is used to energize reactive species and assist in adsorption of reactants and desorption of process byproducts from the surface 816 of substrate 625, typically ranges from about 0.8 µm to about 1.2 µm, for example, between about 0.95 µm to about 1.05 µm, with combinations of various wavelengths being provided, depending, for example, on the composition of the film which is being epitaxially grown.

The component gases enter the processing volume 818 via gas distribution assembly 850. Gas flows from the gas distribution assembly 850 and exits through port 838 as shown generally at 822. Combinations of component gases, which are used to clean/passivate a substrate surface, or to form the silicon and/or germanium-containing film that is being epitaxially grown, are typically mixed prior to entry into the processing volume. The overall pressure in the processing volume 818 may be adjusted by a valve (not shown) on the outlet port 838. At least a portion of the interior surface of the processing volume 818 is covered by a liner 831. In one embodiment, the liner 831 comprises a quartz material that is opaque. In this manner, the chamber wall is insulated from the heat in the processing volume 818.

The temperature of surfaces in the processing volume 818 may be controlled within a temperature range of about 200° C. to about 600° C., or greater, by the flow of a cooling gas, which enters through a port 812 and exits through port 813, in combination with radiation from upper lamp modules 810A positioned above upper quartz window 804. The temperature in the lower quartz chamber 824 may be controlled within a temperature range of about 200° C. to about 600° C. or greater, by adjusting the speed of a blower unit which is not shown, and by radiation from the lower lamp modules 810B disposed below lower quartz chamber 824. The pressure in the processing volume 818 may be between about 0.1 Torr to about 600 Torr, such as between about 5 Torr to about 30 Torr.

The temperature on the substrate 625 surface 816 may be controlled by power adjustment to the lower lamp modules 810B in lower quartz chamber 824, or by power adjustment to both the upper lamp modules 810A overlying upper quartz chamber 804, and the lower lamp modules 810B in lower quartz chamber 824. The power density in the processing volume 818 may be between about 40 W/cm$^2$ to about 400 W/cm$^2$, such as about 80 W/cm$^2$ to about 120 W/cm$^2$.

In one aspect, the gas distribution assembly 850 is disposed normal to, or in a radial direction 806 relative to, the longitudinal axis 802 of the chamber 800 or substrate 625. In this orientation, the gas distribution assembly 850 is adapted to flow process gases in a radial direction 806 across, or parallel to, the surface 816 of the substrate 625. In one processing application, the process gases are preheated at the point of introduction to the chamber 800 to initiate preheating of the gases prior to introduction to the processing volume 818, and/or to break specific bonds in the gases. In this manner, surface reaction kinetics may be modified independently from the thermal temperature of the substrate 625.

In operation, precursors to form Si and SiGe blanket or selective films are provided to the gas distribution assembly 850 from the one or more gas sources 840A and 840B. IR lamps 856 (only one is shown in FIG. 8) may be utilized to heat the precursors within the gas distribution assembly 850 as well as along the flow path 822. The gas sources 840A, 840B may be coupled the gas distribution assembly 850 in a manner configured to facilitate introduction zones within the gas distribution assembly 850, such as a radial outer zone and a radial inner zone between the outer zones when viewed in from a top plan view. The gas sources 840A, 840B may include valves (not shown) to control the rate of introduction into the zones.

The gas sources 840A, 840B may include silicon precursors such as silanes, including silane ($SiH_4$), disilane ($Si_2H_6$), dichlorosilane ($SiH_2Cl_2$), hexachlorodisilane ($Si_2Cl_6$), dibromosilane ($SiH_2Br_2$), higher order silanes, derivatives thereof, and combinations thereof. The gas sources 840A, 840B may also include germanium containing precursors, such as germane ($GeH_4$), digermane ($Ge_2H_6$), germanium tetrachloride ($GeCl_4$), dichlorogermane ($GeH_2Cl_2$), derivatives thereof, and combinations thereof. The silicon and/or germanium containing precursors may be used in combination with hydrogen chloride (HCl), chlorine gas ($Cl_2$), hydrogen bromide (HBr), and combinations thereof. The gas sources 840A, 840B may include one or more of the silicon and germanium containing precursors in one or both of the gas sources 840A, 840B.

The precursor materials enter the processing volume 818 through openings or a plurality of holes 858 (only one is shown in FIG. 8) in the perforated plate 854 in this excited state, which in one embodiment is a quartz material, having the holes 858 formed therethrough. The perforated plate 854 is transparent to IR energy, and may be made of a clear quartz material. In other embodiments, the perforated plate 854 may be any material that is transparent to IR energy and is resistant to process chemistry and other process chemistries. The energized precursor materials flow toward the processing volume 818 through the plurality of holes 858 in the perforated plate 854, and through a plurality of channels 852 (only one is shown in FIG. 8). A portion of the photons and non-thermal energy from the IR lamps 856 also passes through the holes 858, the perforated plate 854, and channels 852 facilitated by a reflective material and/or surface disposed on the interior surfaces of the gas distribution assembly 850, thereby illuminating the flow path of the precursor materials (shown as arrow 822 in FIG. 8). In this manner, the vibrational energy of the precursor materials may be maintained from the point of introduction to the processing volume 818 along the flow path.

Figure 9:
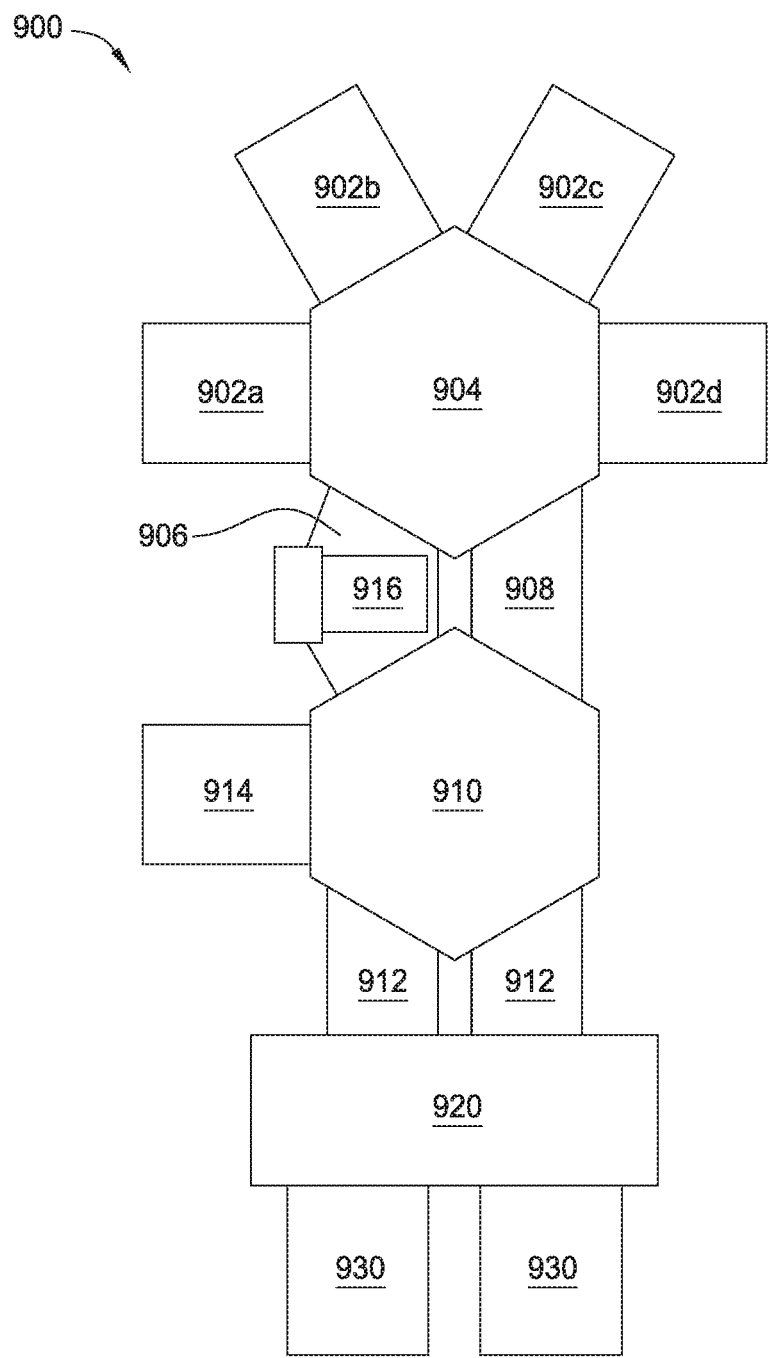
FIG. 9 illustrates an exemplary vacuum processing system for performing cleaning and deposition processes as described herein.

FIG. 9 illustrates an exemplary vacuum processing system 900 that can be used to complete the processing sequence 100 illustrated in FIG. 1, according to implementations of the present disclosure. As shown in FIG. 9, a plurality of processing chambers 902a, 902b, 902c, 902d are coupled to a first transfer chamber 904. The processing chambers 902a-902d may be used to perform any substrate related processes, such as annealing, chemical vapor deposition, physical vapor deposition, epitaxial process, etching process, thermal oxidation or thermal nitridation process, degassing etc. In one implementation, the processing chamber 902a may be a film formation chamber, such as a vapor phase epitaxy deposition chamber, for example an Epi chamber available from Applied Materials, Santa Clara, Calif., that is capable of forming a crystalline silicon or silicon germanium. In another implementation, the processing chamber 902a may be an epitaxy deposition chamber such as the single-substrate processing chamber 600 described in connection with FIG. 6. In another implementation, the processing chamber 902a may be the process chamber 700 described in connection with FIG. 7. In another implementation, the processing chamber 902a may be the process chamber 800 described in connection with FIG. 8.

The processing chamber 902b may be a rapid thermal processing chamber (RTP). The processing chamber 902c is a plasma etching chamber or a plasma cleaning chamber. For example the processing chamber 902c may be the processing chamber 200 described in connection with FIG. 2A or the processing chamber 300 described in connection with FIG. 3. The processing chamber 902d may be a degassing chamber. The first transfer chamber 904 is also coupled to at least one transition station, for example a pair of pass-through stations 906, 908. The pass-through stations 906, 908 maintain vacuum conditions while allowing substrates to be transferred between the first transfer chamber 904 and a second transfer chamber 910. The first transfer chamber 904 has a robotic substrate handling mechanism (not shown) for transferring substrates between the pass-through stations 906, 908 and any of the processing chambers 902a-902d. The processing chambers 902a-902d are shown configured in a certain order in FIG. 9, but they may be configured in any desired order.

One end of the pass-through stations 906, 908 is coupled to the second transfer chamber 910. Therefore, the first transfer chamber 904 and the second transfer chamber 910 are separated and connected by the pass-through stations 906, 908. The second transfer chamber 910 is coupled to a first plasma-cleaning chamber 914, which can be a plasma chamber such as the processing chamber 200 (FIG. 2A) that is adapted to perform at least some of the processes found in box 902 for removing oxides from a surface of a substrate. In one implementation, the first plasma-cleaning chamber 914 is a Siconi™ or Selectra™ chamber, which is available from Applied Materials, Santa Clara, Calif. In another implementation, the plasma cleaning chamber 914 may be the processing chamber 200 described in connection with FIG. 2A. In another implementation, the plasma cleaning chamber 914 may be the processing chamber 300 described in connection with FIG. 3. In yet another implementation, two processing chambers 200 are positioned in the plasma cleaning chamber 914 positions, two process chambers 300 chambers are positioned in stations 906 and 908, and four epi chambers are positioned in the processing chambers 902a-902d.

In one implementation, the at least one transition station, for example one of the pass-through stations 906, 908, is configured to be a plasma-cleaning chamber. Alternatively, a plasma-cleaning chamber may be coupled to one of the pass-through stations 906, 908 for removing contaminants from the surface of the substrate. Thus, the processing system 900 may have a second plasma-cleaning chamber that is, or is connected to, one of the pass-through stations 906, 908. In one implementation shown in FIG. 9, the pass-through station 906 includes a second plasma-cleaning chamber 916. The second plasma-cleaning chamber 916 may be a version of the processing chamber 300 (FIG. 3) that is adapted to perform at least some of the processes found in box 104 for removing contaminants from the surface of the substrate. It should be noted that, although only one plasma-cleaning chamber 916 is shown coupled to a pass-through station, in this case the pass-through station 906, a plasma-cleaning chamber (e.g., a version of the processing chamber 300) may be positioned within both of the pass-through stations 906 and 908.

The second transfer chamber 910 also has a robotic substrate handling mechanism (not shown) for transferring substrates between a set of load lock chamber 912 and the first plasma-cleaning chamber 914 or the second plasma-cleaning chamber 916, or the pass through to the back transfer chambers 906/908. A factory interface 920 is connected to the second transfer chamber 910 by the load lock chambers 912. The factory interface 920 is coupled to one or more pods 930 on the opposite side of the load lock chambers 912. The pods 930 typically are front opening unified pods (FOUP) that are accessible from a clean room (not shown).

While two transfer chambers are shown, it is contemplated that any of the transfer chambers may be omitted. In one implementation where the first transfer chamber 914 is omitted, the second plasma-cleaning chamber 916 may be disposed within or coupled to the second transfer chamber 910 at the location currently shown as occupied by the pass-through stations 906 or 908. The second transfer chamber 910 may be coupled to one or more processing chambers capable of forming crystalline silicon or silicon germanium, such as an epitaxy chamber, for example a Centura™ Epi chamber available from Applied Materials, Inc., of Santa Clara, Calif.

In operation, substrates are carried from pods 930 to the vacuum processing system 900 in a transport cassette (not shown) that is located within one of the load lock chambers 912. The robotic transport mechanism within the second transfer chamber 910 transports the substrates, one at a time, from the load lock chambers 912 to the first plasma-cleaning chamber 914 where the a cleaning process, e.g., processes found in box 102, is performed to remove oxides from a surface of a substrate. Once the oxides have been removed from the substrate surface, the robotic transport mechanism disposed within the second transfer chamber 910 transfers the substrate from the first plasma-cleaning chamber 914 to the second plasma-cleaning chamber 916 where a reducing process, e.g., processes found in box 104, is performed to remove contaminants such as carbon or hydrocarbons from the substrate surface. It is contemplated that the steps here may also be performed in the reverse order, i.e., using the robotic transport mechanism to transfer the substrate from the second plasma-cleaning chamber 916 to the first plasma-cleaning chamber 914. In either case, the clean substrates are then transferred by the robotic transport mechanism disposed within the first transfer chamber 904 from the second plasma-cleaning chamber 916 (or the first plasma-cleaning chamber 914) to one or more processing chambers 902a-902d. The one or more processing chambers 902a-902d may include an epitaxy process chamber where a layer formation process, such as the epitaxial deposition described in box 106, is performed.

Upon completion of processing in the one or more processing chambers 902a-902d, the robotic transport mechanism disposed within the first transfer chamber 904 moves the substrate from either one of the processing chambers 902 to the pass-through station 908. The substrate is then removed from the pass-through station 908 by the robotic transport mechanism disposed within the second transfer chamber 910 and transferred to the other load lock chamber 912 through which it is withdrawn from the vacuum processing system 900.

Since the processes of all three boxes 102, 104 and 106 are performed within the same vacuum processing system 900, vacuum is not broken as the substrate is transferred among various chambers, which decreases the chance of contamination and improves the quality of the deposited epitaxial film. It should be understood that the movement of the substrates is described herein for illustration purposes. A controller (not shown) may be used to schedule the movement of the substrates through the vacuum processing system 900 in accordance with a desired sequencing program, which may vary depending upon the application.

Benefits of the present disclosure include an improved vacuum processing system integrating two different types of pre-clean process chambers with the epitaxial process chamber on the same vacuum processing system. The pre-clean process chambers may include a first plasma-cleaning process chamber and a second plasma-cleaning process chamber. Co-existence of two types of surface materials removal chamber on the same vacuum processing system allows substrates to remain in vacuum between surface preparation and epitaxial deposition, which reduces the time the substrates are exposed to ambient and eliminates the need to prepare the substrates on a separate processing chamber or system. This architecture also maximizes the number of process chambers on a vacuum system because the pass-through station between two transfer chambers also functions as a pre-clean process chamber, which also reduces overall handling time of the substrates.

An example of the process 102 of FIG. 1 can be performed in the processing chamber 200 of FIG. 2A. Argon is routed through the remote plasma unit 252, a first mixture of 5-10% HF in argon is routed through the inlet 256, and a second mixture of 25% $NH_3$ in argon is routed through the inlet 258. The remote plasma is formed by applying 500 W of microwave or RF power to argon gas flowing at 2 sLm. The first mixture is flowed through the first inlet 256 at 500 sccm and the second mixture is flowed through the second inlet 258 at 500 sccm. The substrate is maintained at a temperature of 10 degrees Celsius by routing temperature control fluid through the thermal control plenum 235. The substrate support 232 may be powered to provide radial temperature control. The chamber is maintained at a pressure of 5 Torr, and the substrate is processed for a time suitable for converting all desired oxides on the substrate surface into sublimable solid, for example 300 seconds. The substrate is then moved close to the second gas distributor 230, which is heated to about 200 degrees Celsius to provide radiant or conductive heating to the substrate surface. The substrate is maintained in proximity to the heat radiating from the second gas distributor 230 for 1-5 minutes to sublime the solids formed on the substrate surface, leaving an oxygen-free surface. The substrate may then be optionally heat-treated under an inert atmosphere to remove any residual species from the oxide removal process, such as fluorine containing species. The heat treatment may include disposing the substrate in a thermal treatment chamber and energizing a thermal treatment apparatus in the chamber to heat the substrate to a temperature of about 300 degrees Celsius for about 1 minute.

An example of the process 104 of FIG. 1 can be performed in the processing chamber 300 of FIG. 3. Hydrogen gas is routed through the remote plasma source 350, which is powered at 500 W with microwave or RF power, at 2 sLm. The substrate is maintained at a temperature of about 400 degrees Celsius by heating the substrate support 314, and the process region 330 is maintained at a pressure of about 0.5 Torr. The substrate is processed at these conditions for a time suitable to remove all desired contaminant or foreign species and hydrogen terminate the surface of the substrate, for example about 1 minute. The substrate may then be optionally further heat treated, or annealed, under inert atmosphere by supplying an inert gas such as argon through the conduit 360 while discontinuing plasma power in the remote plasma source 350. The substrate can be maintained at an anneal temperature of 600 degrees Celsius. Alternately, the substrate can be moved to an anneal chamber, which may be coupled, for example, to the processing system 900 described in connection with FIG. 9, and annealed, or heat treated, at a higher temperature such as 800-1000 degrees Celsius, to remove any remaining surface defects to leave a uniformly clean and well-ordered surface crystal structure having minimal defects and impurities.

While the foregoing is directed to implementations of the present disclosure, other and further implementations of the disclosure may be devised without departing from the basic scope thereof.

The invention claimed is:

1. A processing system, comprising:
a transfer chamber coupled to at least one vapor phase epitaxy chamber;
a vacuum chamber coupled to the transfer chamber, the vacuum chamber including an oxide removal chamber, the oxide removal chamber comprising:
a lid assembly, with a mixing chamber and a gas distributor;
a first gas inlet formed through a portion of the lid assembly and in fluid communication with the mixing chamber;
a second gas inlet formed through a portion of the lid assembly and in fluid communication with the mixing chamber;
a third gas inlet formed through a portion of the lid assembly and in fluid communication with the mixing chamber; and
a substrate support with
a substrate supporting surface;
a cooling channel; and
a lift member disposed in a recess of the substrate supporting surface and coupled through the substrate support to a lift actuator; and
a plasma contaminant removal chamber coupled to the transfer chamber, the plasma contaminant removal chamber comprising:
a remote plasma source; and
a substrate support operable to heat a substrate disposed thereon to a temperature between 25 degrees Celsius and 650 degrees Celsius.

2. The processing system of claim 1, wherein the oxide removal chamber comprises a plasma generation source.

3. The processing system of claim 2, wherein the plasma generation source comprises the remote plasma source that is configured to form a plasma therein by use of an RF source or a microwave source.

4. The processing system of claim 2, wherein the remote plasma source is coupled to a lid of the oxide removal chamber.

5. The processing system of claim 1, wherein the oxide removal chamber includes a remote plasma chamber.

6. The processing system of claim 1, wherein the oxide removal chamber is a fluorine processing chamber, and the plasma contaminant removal chamber is a hydrogen processing chamber.

7. The processing system of claim 6, further comprising a rapid thermal processing chamber coupled to the transfer chamber.

8. The processing system of claim 7, further comprising an anneal chamber coupled to the transfer chamber.

9. A method of processing a substrate, comprising:
loading a substrate into a transfer chamber;
transferring the substrate from the transfer chamber to an oxide removal chamber coupled to the transfer chamber, wherein the oxide removal chamber comprises:
a lid assembly, with a mixing chamber and a gas distributor;
a first gas inlet formed through a portion of the lid assembly and in fluid communication with the mixing chamber;
a second gas inlet formed through a portion of the lid assembly and in fluid communication with the mixing chamber; and
a third gas inlet formed through a portion of the lid assembly and in fluid communication with the mixing chamber;
removing oxides from the substrate by a process that includes exposing the substrate to a processing gas comprising $NH_3$, HF, and inert gases mixed in the mixing chamber;
transferring the substrate to a plasma contaminant removal vacuum chamber coupled to the transfer chamber and positioning the substrate on a substrate support in the plasma contaminant removal chamber;
heating the substrate on the substrate support to a temperature between 25 degrees Celsius and 650 degrees Celsius;
removing contaminants from the substrate by a process that includes exposing the substrate to hydrogen radicals introduced from a remote plasma source in fluid communication with the plasma contaminant removal chamber;
transferring the substrate from the plasma containment removal vacuum chamber to the transfer chamber;
transferring the substrate from the transfer chamber into a process chamber coupled to the transfer chamber; and
forming a film on the substrate by an epitaxy process within the process chamber.

10. The method of claim 9, further comprising removing by-products of the oxide removal process from the substrate by a thermal treatment process.

11. The method of claim 9, wherein the thermal treatment process is performed in the same chamber as the hydrogen radical exposure process.

12. The method of claim 9, wherein the oxide removal process comprises:
disposing the substrate in the oxide removal chamber;
forming a plasma from an inert gas;
flowing the plasma into the mixing chamber with $NH_3$ and HF to form a reaction mixture;
flowing the reaction mixture into the oxide removal chamber, and
exposing the substrate to the reaction mixture.

13. The method of claim 12, wherein the oxide removal process further comprises heating the substrate to a temperature of at least 100 degrees Celsius after the exposure to the reaction mixture.

14. The method of claim 9, wherein exposing the substrate to hydrogen radicals comprises:
removing ions from the plasma using a magnetic field.

15. The method of claim 14, further comprising:
before exposing the substrate to a fluorine containing chemistry, disposing the substrate in a thermal treatment chamber;
flowing an inert gas into the thermal treatment chamber; and heating the substrate to a temperature of 400 degrees Celsius or greater.

16. The method of claim 14, wherein exposing the substrate to hydrogen radicals comprises heating the substrate to a temperature of at least 400 degrees Celsius.

17. The processing system of claim 1, wherein the transfer chamber is a first transfer chamber, and the vacuum chamber comprises a pass-through station, and the system further comprises:
   a second transfer chamber coupled to the first transfer chamber by the pass-through station, wherein the oxide removal chamber is disposed in the pass-through station and the oxide removal chamber is a plasma chamber.

* * * * *